United States Patent
Yu et al.

(10) Patent No.: US 10,861,751 B2
(45) Date of Patent: Dec. 8, 2020

(54) METHOD OF SEMICONDUCTOR INTEGRATED CIRCUIT FABRICATION

(71) Applicant: Taiwan Semiconductor Manufacturing Co., Ltd., Hsinchu (TW)

(72) Inventors: De-Wei Yu, Ping-Tung (TW); Chia Ping Lo, Jhubei (TW); Liang-Gi Yao, Shin Chu (TW); Weng Chang, Hsin-Chu (TW); Yee-Chia Yeo, Hsinchu (TW); Ziwei Fang, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 16/687,152

(22) Filed: Nov. 18, 2019

(65) Prior Publication Data
US 2020/0083112 A1      Mar. 12, 2020

Related U.S. Application Data

(63) Continuation of application No. 16/016,862, filed on Jun. 25, 2018, now Pat. No. 10,483,170, which is a
(Continued)

(51) Int. Cl.
*H01L 21/8238* (2006.01)
*H01L 21/8234* (2006.01)
(Continued)

(52) U.S. Cl.
CPC ........... *H01L 21/823821* (2013.01); *H01L 21/02532* (2013.01); *H01L 21/02592* (2013.01);
(Continued)

(58) Field of Classification Search
CPC ..... H01L 21/823481; H01L 21/823878; H01L 21/02318; H01L 21/02345–02359; H01L 21/3105; H01L 21/76224; H01L 21/823828; H01L 21/823431; H01L 21/324; H01L 21/3247; H01L 29/66545; H01L 29/66795; H01L 29/785; H01L 27/0886; H01L 27/0924; H01L 27/1211;
(Continued)

(56) References Cited

U.S. PATENT DOCUMENTS 5,888,876 A    3/1999  Shiozawa et al.
6,180,480 B1   1/2001  Economikos et al.
(Continued)

*Primary Examiner* — Errol V Fernandes
*Assistant Examiner* — Jeremy J Joy
(74) *Attorney, Agent, or Firm* — Haynes and Boone, LLP

(57) ABSTRACT

A method includes providing a substrate including a first fin element and a second fin element extending from the substrate, and forming a first layer including a first material over the first and second fin elements, wherein the first layer includes a gap disposed between the first and second fin elements. An anneal process is performed to remove the gap in the first layer, wherein performing the anneal process includes adjusting an energy applied to the first layer during the anneal process. The gap is filled by a portion of the first material around the gap reaching a sub-melt temperature that is different from a melting point of the first material.

20 Claims, 26 Drawing Sheets

Related U.S. Application Data continuation of application No. 15/282,981, filed on Sep. 30, 2016, now Pat. No. 10,008,418.

(51) Int. Cl.
*H01L 21/02* (2006.01)
*H01L 21/268* (2006.01)
*H01L 21/324* (2006.01)
*H01L 29/66* (2006.01)

(52) U.S. Cl.
CPC .......... *H01L 21/268* (2013.01); *H01L 21/324* (2013.01); *H01L 21/3247* (2013.01); *H01L 21/823431* (2013.01); *H01L 21/823481* (2013.01); *H01L 21/823828* (2013.01); *H01L 21/823878* (2013.01); *H01L 29/66545* (2013.01); *H01L 29/66795* (2013.01)

(58) Field of Classification Search
CPC ..... H01L 21/267; H01L 29/0649–0653; H01L 29/4991; H01L 29/515; C23C 14/5806–582
See application file for complete search history.

(56) References Cited

U.S. PATENT DOCUMENTS

| | | | |
|---|---|---|---|
| 6,323,457 B1 * | 11/2001 | Jung | B23K 26/702 219/121.83 |
| 6,727,176 B2 | 4/2004 | Ngo et al. | |
| 6,759,284 B2 | 7/2004 | Kang et al. | |
| 6,890,833 B2 | 5/2005 | Belyanski et al. | |
| 6,900,121 B1 * | 5/2005 | Ngo | H01L 21/3105 257/E21.241 |
| 6,987,064 B2 | 1/2006 | Chung et al. | |
| 7,410,869 B2 | 8/2008 | Learn et al. | |
| 7,667,271 B2 | 2/2010 | Yu et al. | |
| 8,362,575 B2 | 1/2013 | Kwok et al. | |
| 8,367,498 B2 | 2/2013 | Chang et al. | |
| 8,440,517 B2 | 5/2013 | Lin et al. | |
| 8,497,528 B2 | 7/2013 | Lee et al. | |
| 8,519,538 B2 | 8/2013 | Hsia et al. | |
| 8,610,240 B2 | 12/2013 | Lee et al. | |
| 8,642,458 B2 | 2/2014 | Chung et al. | |
| 8,680,576 B2 | 3/2014 | Ching et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,735,252 B2 | 5/2014 | Yu et al. | |
| 8,785,285 B2 | 7/2014 | Tsai et al. | |
| 8,796,759 B2 | 8/2014 | Perng et al. | |
| 8,809,139 B2 | 8/2014 | Huang et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 9,130,058 B2 | 9/2015 | Chen et al. | |
| 9,190,481 B2 | 11/2015 | Zhao et al. | |
| 9,246,002 B2 | 1/2016 | Hsiao et al. | |
| 9,299,803 B2 * | 3/2016 | Tsai | H01L 21/02164 |
| 9,312,145 B2 | 4/2016 | Tong et al. | |
| 9,368,497 B2 | 6/2016 | Zhao et al. | |
| 9,406,546 B2 | 8/2016 | Tsai et al. | |
| 9,443,980 B2 | 9/2016 | Jensen et al. | |
| 9,608,061 B2 | 3/2017 | Zhao et al. | |
| 9,640,423 B2 | 5/2017 | Krishnan et al. | |
| 9,812,451 B2 | 11/2017 | Liu et al. | |
| 9,837,271 B2 | 12/2017 | Van Aerde et al. | |
| 2003/0036251 A1 * | 2/2003 | Mitsuhashi | H01L 29/78675 438/487 |
| 2004/0048453 A1 * | 3/2004 | Kang | C30B 13/00 438/486 |
| 2004/0105096 A1 * | 6/2004 | Takami | G01N 21/211 356/369 |
| 2004/0192009 A1 * | 9/2004 | Belyansky | H01L 21/76224 438/424 |
| 2005/0078298 A1 * | 4/2005 | Takami | H01L 21/02686 356/30 |
| 2006/0024429 A1 * | 2/2006 | Horii | H01L 45/143 427/97.7 |
| 2011/0014726 A1 | 1/2011 | Yu et al. | |
| 2011/0068407 A1 | 3/2011 | Yeh et al. | |
| 2012/0074485 A1 | 3/2012 | Ham et al. | |
| 2012/0315752 A1 * | 12/2012 | Chung | H01L 21/32115 438/652 |
| 2013/0011983 A1 | 1/2013 | Tsai et al. | |
| 2014/0213034 A1 * | 7/2014 | Chang | H01L 21/76224 438/424 |
| 2014/0252412 A1 | 9/2014 | Tsai et al. | |
| 2015/0104923 A1 * | 4/2015 | Tsai | H01L 21/02274 438/424 |
| 2015/0206949 A1 | 7/2015 | Zhao | |
| 2015/0325669 A1 | 11/2015 | Zhu et al. | |
| 2015/0325787 A1 * | 11/2015 | Ahn | H01L 45/141 438/382 |
| 2015/0348966 A1 * | 12/2015 | Zhao | H01L 21/02326 257/401 |
| 2016/0020094 A1 * | 1/2016 | Van Aerde | H01L 21/02592 438/486 |
| 2016/0035603 A1 * | 2/2016 | Ikenoue | B23K 26/0622 219/121.65 |
| 2016/0141176 A1 | 5/2016 | Van Aerde et al. | |
| 2017/0033178 A1 * | 2/2017 | Krishnan | H01L 29/7851 |

* cited by examiner

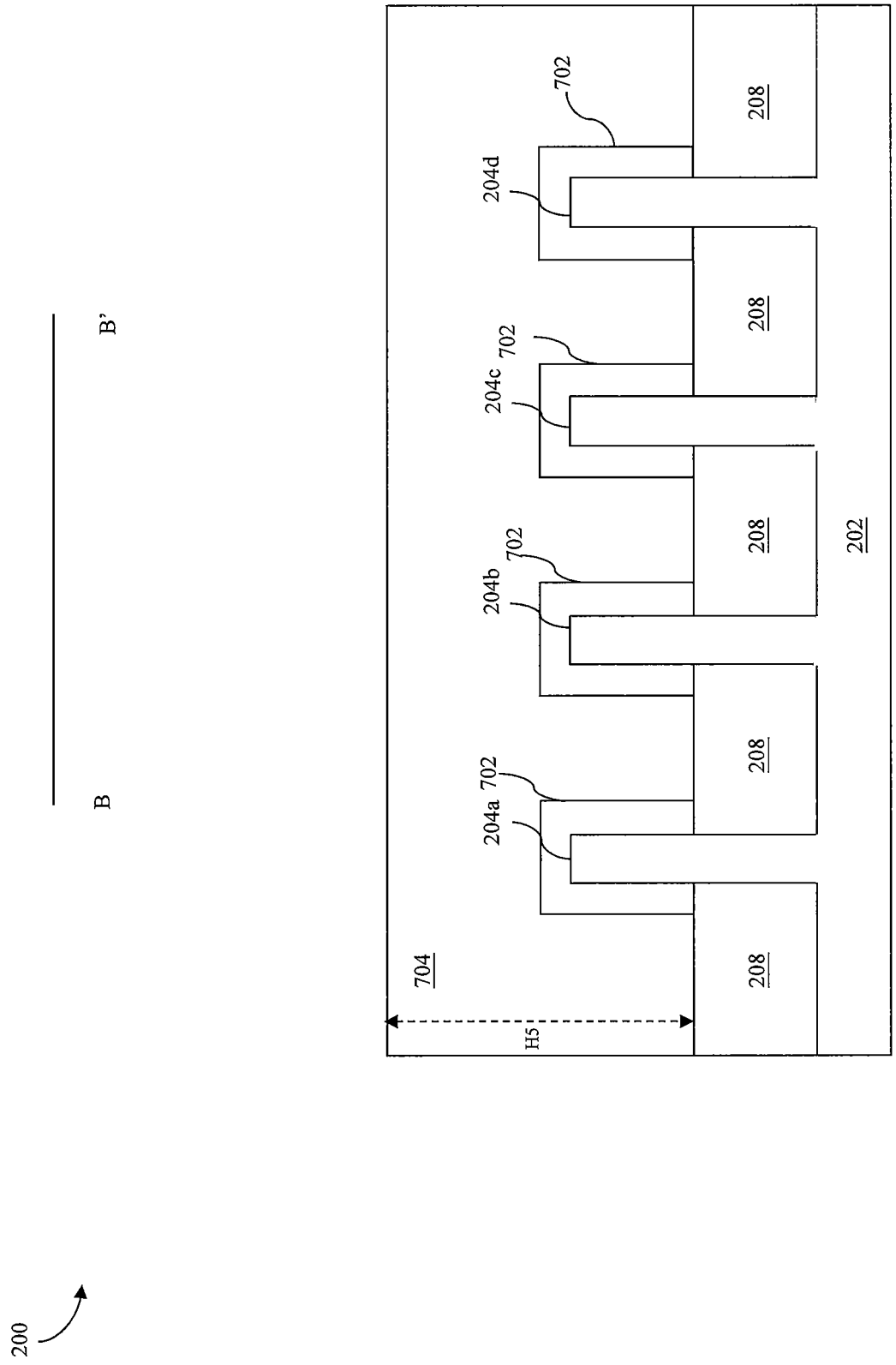

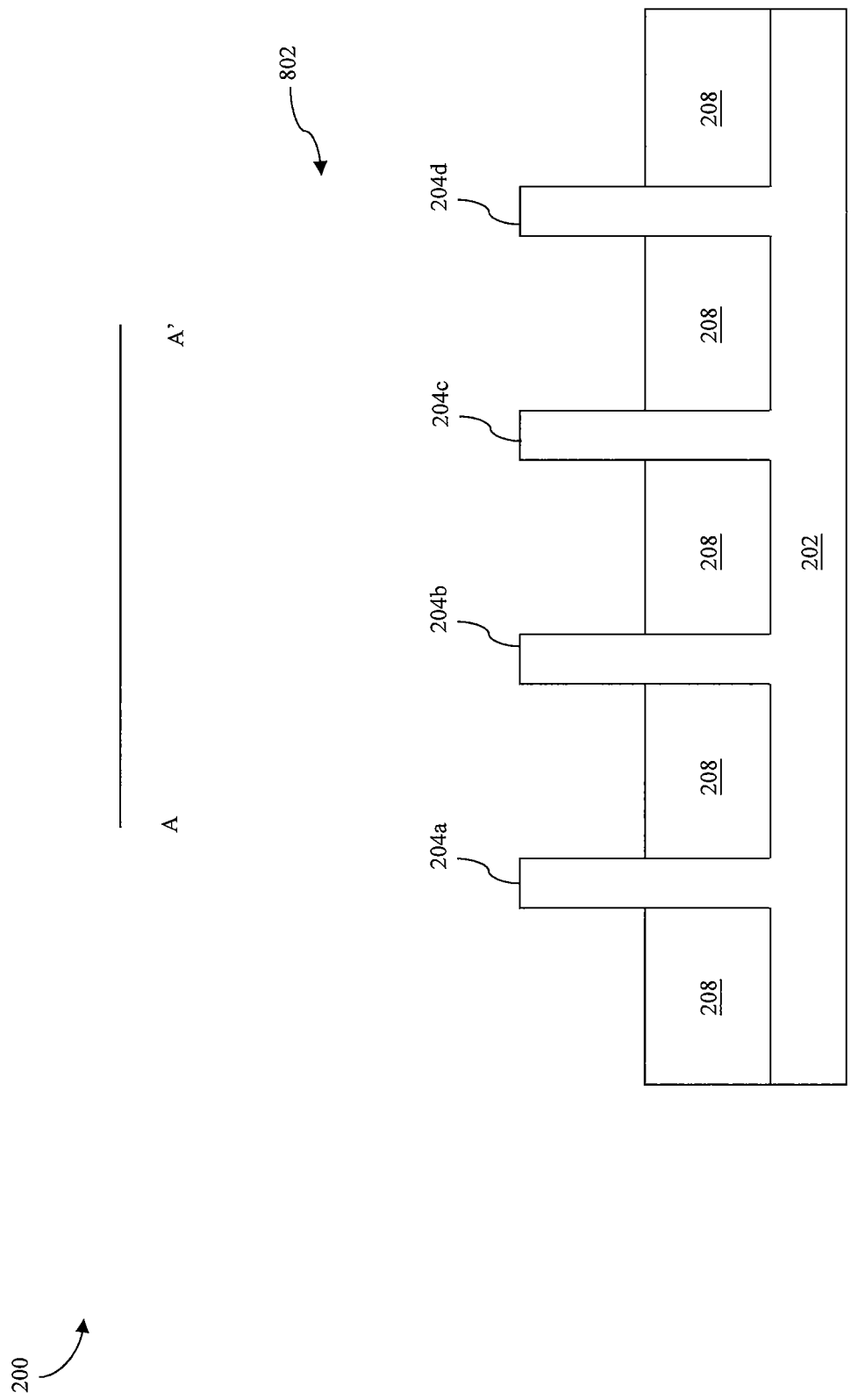

# METHOD OF SEMICONDUCTOR INTEGRATED CIRCUIT FABRICATION

PRIORITY DATA

The present application is a continuation application of U.S. patent application Ser. No. 16/016,862, filed Jun. 25, 2018, issuing as U.S. Pat. No. 10,483,170, which is a continuation application of U.S. patent application Ser. No. 15/282,981, filed Sep. 30, 2016, now U.S. Pat. No. 10,008,418 entitled "METHOD OF SEMICONDUCTOR INTEGRATED CIRCUIT FABRICATION", each of which is hereby incorporated by reference in its entirety.

BACKGROUND

The electronics industry has experienced an ever increasing demand for smaller and faster electronic devices which are able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure (fin element) which extends from a substrate on which it is formed, and which is used to form the FET channel. FinFETs three-dimensional structure allows them to be aggressively scaled while maintaining gate control and mitigating SCEs. However, conventional methods to make FinFET devices may still have certain drawbacks. For example, in the formation of FinFET devices, trenches are formed between fin elements of the FinFET devices, which are then filled with a material. As the widths of the trenches get smaller, gaps (e.g. air pockets) are formed in the material filling the trenches. Such gaps may cause various issues during subsequent processes, resulting in flaws in subsequent formed features. This affects the quality of performance of the FinFET devices. Thus, the existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A, 7B, and 7C are cross-sectional views of a portion of a semiconductor device according to some embodiments.

FIG. 8A is a cross-sectional view of a portion of a semiconductor device according to some embodiments.

DETAILED DESCRIPTION

Figure 1:
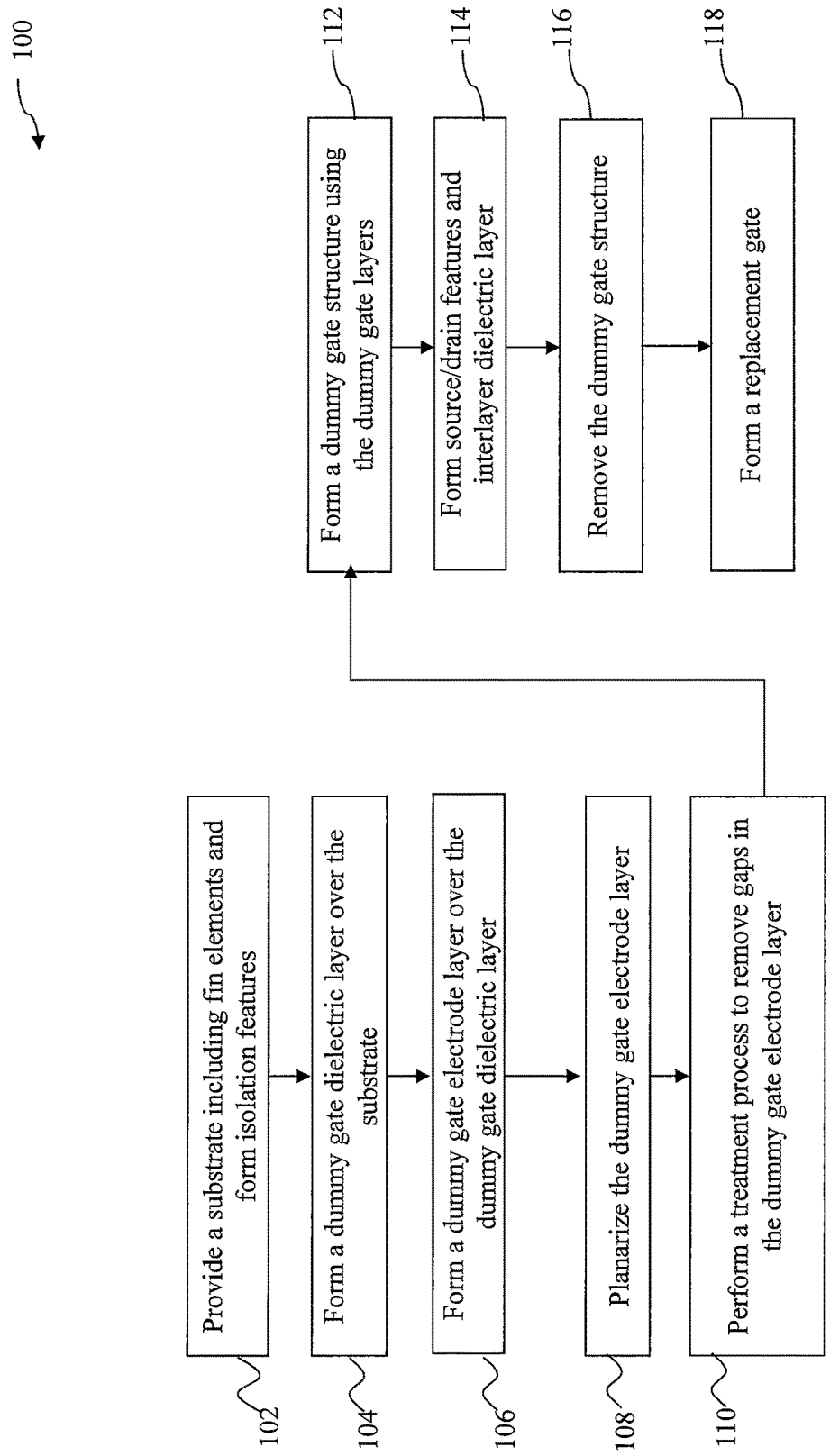
FIG. 1 is a flow chart of a method of forming a semiconductor device or portion thereof according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of fin-type transistors referred to herein as FinFET devices. Such a device may include a`

P-type metal-oxide-semiconductor (PMOS) FinFET device and/or an N-type metal-oxide-semiconductor (NMOS) FinFET device.

Illustrated in FIG. 1 is a method 100 of semiconductor fabrication including fabricating FinFET devices. It is understood that the method 100 includes steps having features of a complementary metal-oxide-semiconductor (CMOS) technology process flow and thus, are only described briefly herein. Additional steps may be performed before, after, and/or during the method 100.

Figure 2A:
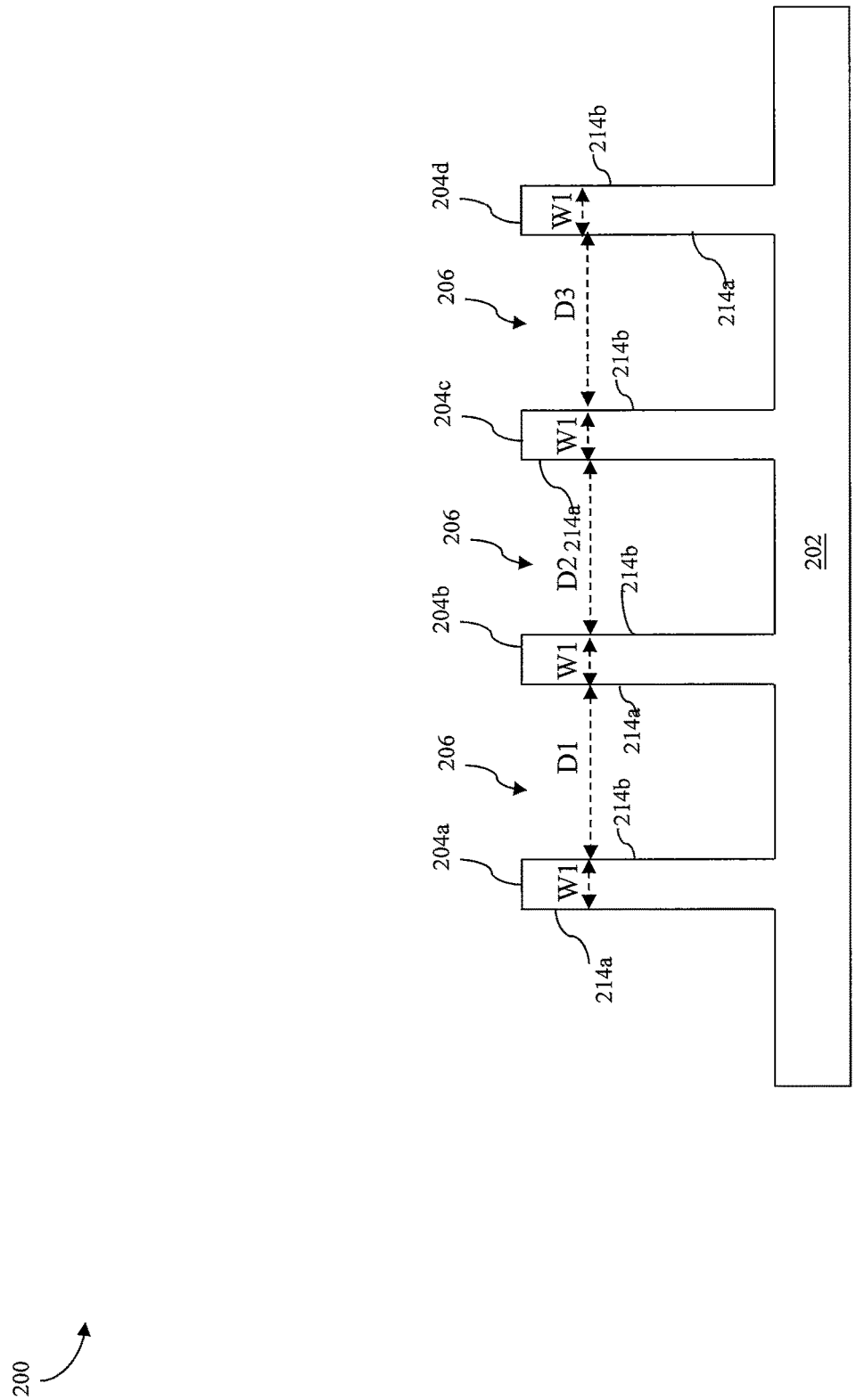
FIGS. 2A, 2B, 2C, 2D, and 2E are cross-sectional views of a portion of a semiconductor device according to aspects of the method of FIG. 1

Referring to FIGS. 1 and 2A, 2B, 2C, 2D, and 2E, the method 100 begins at block 102, where a substrate including fin elements are provided and isolation features are formed between the fin elements. Referring to FIG. 2A, a substrate 202 is provided. In some embodiments, the substrate 202 may be a semiconductor substrate such as a silicon substrate. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. The substrate 202 may include various layers, including conductive or insulating layers formed on a semiconductor substrate. The substrate 202 may include various doping configurations depending on design requirements. For example, different doping profiles (e.g., n wells, p wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 typically has isolation features (e.g., shallow trench isolation (STI) features) interposing the regions providing different device types. Further, the substrate 202 may optionally include an epitaxial layer (epi-layer), may be strained for performance enhancement, may include a silicon-on-insulator (SOI) structure, and/or have other suitable enhancement features.

As shown in FIG. 2A, the substrate 202 includes fin elements used for subsequent FinFET formation. Specifically, a plurality of fin elements 204a, 204b, 204c, and 204d extend from the substrate 202. While FIG. 2A illustrates four fin elements, the substrate 202 may include any number of fin elements, and any number of fin elements may be associated with a given gate structure.

In some embodiments, each of fin elements 204a, 204b, 204c, and 204d may have two sidewalls 214a and 214b. For adjacent fin elements (e.g., fin elements 204a and 204b), sidewalls of the adjacent fin elements are facing each other (e.g., sidewall 214b of the fin element 204a and sidewall 214a of the fin element 204b). Fins 204a and 204b are separated from each other by a distance D1, fins 204b and 204c are separated from each other by a distance D2, and fins 204c and 204d are separated from each other by a distance D3.

In an embodiment, each of distances D1, D2, and D3 is between approximately 10 nanometers (nm) and approximately 60 nm (e.g., about 30 nm). In an embodiment, distances D1, D2, and D3 are substantially equal. In some examples, the distance D1 is greater than the distance D2 (e.g., by more than about 20%) and the distance D3 is the same as D2. In some embodiments, each of the fin elements 204a, 204b, 204c, and 204d has a fin width W1. In an embodiment, the fin width W1 is between approximately 5 nm and approximately 15 nm. The fin elements 204a, 204b, 204c, and 204d may have fin widths substantially the same or different from each other.

The fin elements 204a, 204b, 204c, and 204d, as described with reference to the substrate 202, may include silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fin elements 204a, 204b, 204c, and 204d may be fabricated using suitable processes including photolithography and etching processes. The photolithography process may include forming a photoresist layer over the substrate 202, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etching process forms trenches in unprotected regions through the patterned masking element and into the substrate 202, thereby leaving the plurality of extending fin elements 204a, 204b, 204c, and 204d. The trenches 206 between fin elements 204a, 204b, 204c, and 204d may be etched using a dry etching (e.g., reactive ion etching), a wet etching, and/or other suitable processes. Numerous other embodiments of methods to form the fin elements on the substrate may also be used.

Figure 2B:
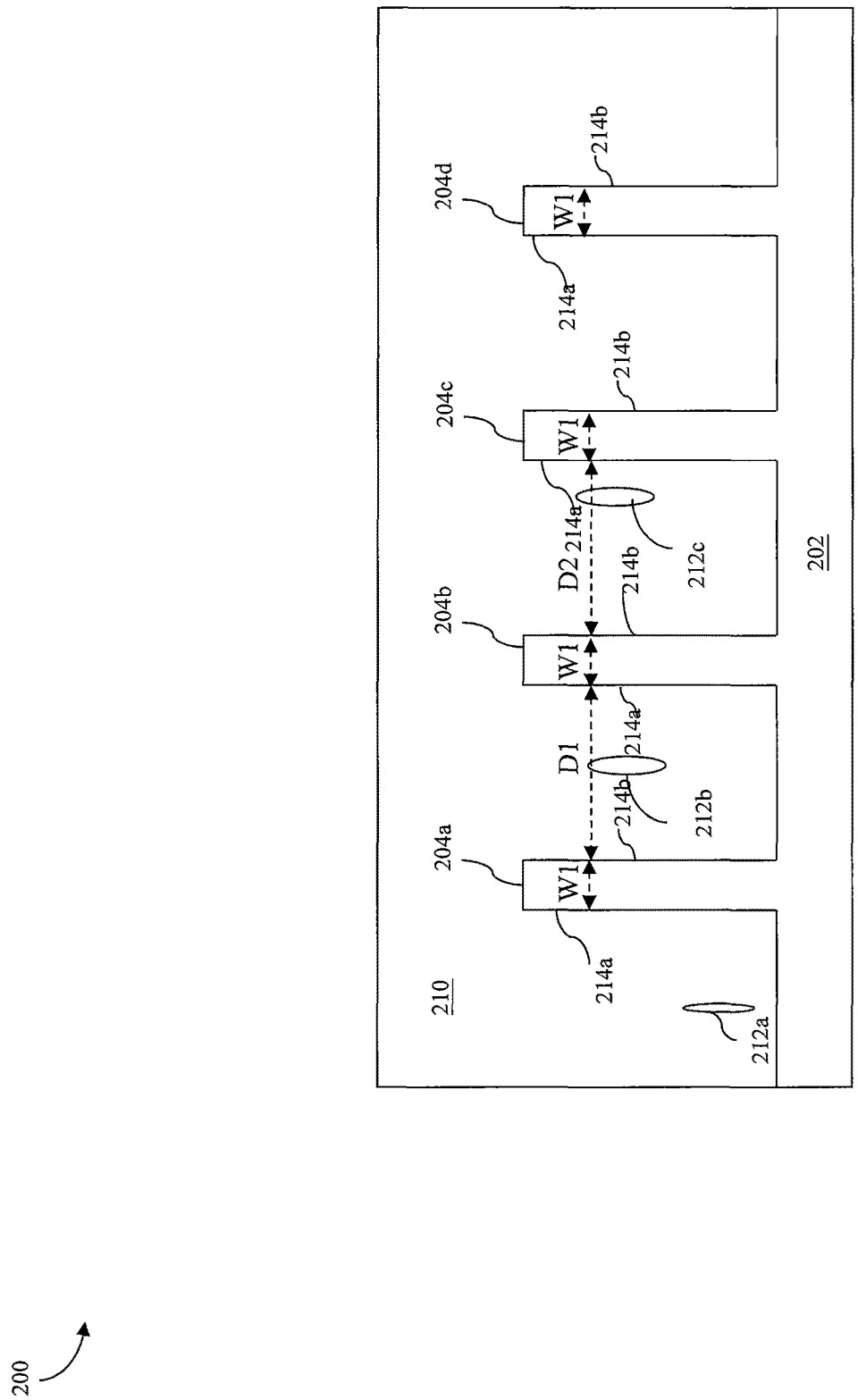

Referring to FIGS. 2B, 2C, 2D, and 2E, isolation features are formed between the fin elements. The isolation features may be shallow trench isolation (STI) features. As illustrated in FIG. 2B, a dielectric layer 210 is deposited over the substrate 202, filling the trenches 206 interposing the fin elements 204a, 204b, 204c, and 204d with the dielectric material. Because of a high aspect ratio of trenches 206 and other processing parameter, gaps (e.g., air pockets) 212a, 212b, and 212c are formed in the dielectric layer 210 during the filling of the trenches 206. As discussed in more detail below, these air pockets are undesirable and treatments are implemented to remove the air pockets from dielectric layer 210.

In some embodiments, the dielectric layer 210 may include $SiO_2$, silicon nitride, silicon oxynitride, silicon carbon nitride (SiCN), silicon oxycarbonitride (SiOCN), fluorine-doped silicate glass (FSG), a low-k dielectric, combinations thereof, and/or other suitable materials. In some embodiments, the dielectric layer (and subsequently formed STI features) may include a multi-layer structure, for example, having one or more liner layers. In various examples, the dielectric layer 210 may be deposited by a chemical vapor deposition (CVD) process, a subatmospheric CVD (SACVD) process, a flowable CVD process, an atomic layer deposition (ALD) process, a physical vapor deposition (PVD) process, and/or other suitable process.

Figure 2C:
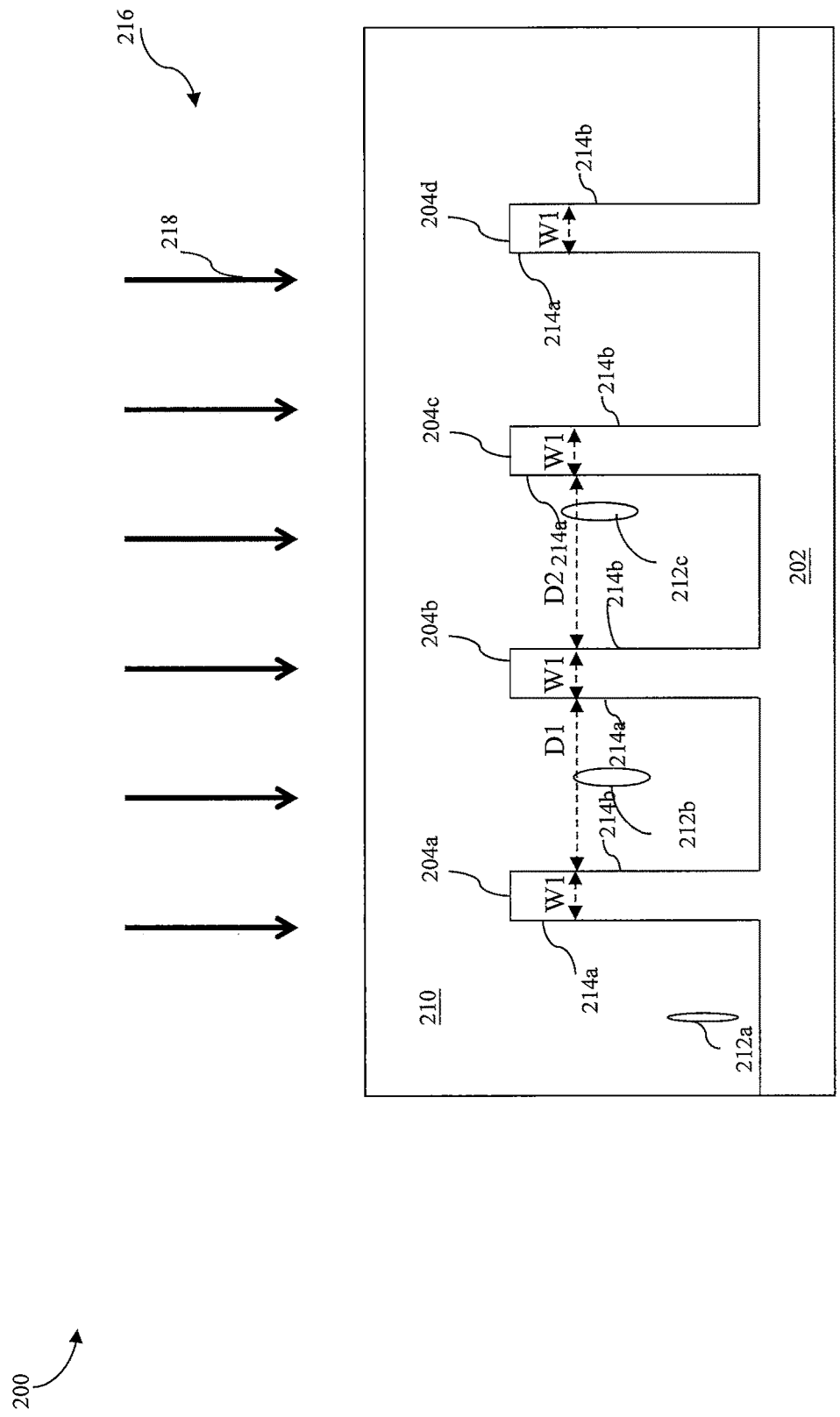

As discussed above, gaps (e.g., air pockets) 212a, 212b, and 212c are formed in the dielectric layer 210 during the filling of the trenches 206. Gaps in the dielectric layer 210 may create problems both during semiconductor device fabrication and in the finished devices. In some examples, the gaps are formed randomly in the dielectric layer 210 and have unpredictable sizes, shapes, locations and population densities, which results in unpredictable and inconsistent post-deposition processing of the dielectric layer 210, such as even etching, polishing, and/or annealing. In some examples, the gaps in the dielectric layer 210 in the finished devices create variations in the dielectric qualities of gaps and trenches in device structures. This can result in uneven and inferior device performance due to electrical crosstalk, charge leakage, and even shorting within and between device elements. Referring to FIG. 2C, a treatment process 216 is performed to the semiconductor device 200 to remove the gaps 212a, 212b, and 212c from dielectric layer 210, thereby improving the quality of the dielectric layer. In some embodiments, the treatment process 216 includes a laser anneal process to irradiate the dielectric layer 210 with laser radiation 218.

In some embodiments, the laser anneal process uses a laser operating in a pulsed mode, and is referred to as a pulsed laser anneal process. In some examples, the pulsed laser anneal process may be controlled by tuning laser anneal parameters (e.g., wavelength, pulse duration (pulse width), pulse energy density, pulse repetition rate, treatment time) so that the gaps 212a, 212b, and 212c in the dielectric layer 210 are removed without damaging the fin elements. In some embodiments, the laser anneal parameters are determined based on various properties of the dielectric layer 210 (e.g., the thickness of the layer, the composition, the absorption spectrum, the reflow point, the melting point) and the fin elements 204a, 204b, 204c, and 204d (e.g., the width w1, the composition, the absorption spectrum, the melting point). In some embodiments, the reflow point of a material is lower than its melting point, and is also referred to as a sub-melt temperature.

In some embodiments, the laser anneal process removes one or more gaps (e.g., gap 212a) in the dielectric layer 210 by inducing thermal expansion and cooling shrinkage of the dielectric layer 210. In some examples, the temperature (e.g., between about 450° C. and about 650° C.) of the portions of the dielectric layer 210 around the gap 212a is less than a reflow point of a material (e.g., a reflow point of between about 900° C. to 1100° C. for $SiO_2$) of the dielectric layer 210.

In some embodiments, the laser anneal process removes one or more gaps (e.g., gaps 212b and 212c disposed above the gap 212a) by filling the one or more gaps by reflowed dielectric material. In an example, the portions of the dielectric layer 210 around the gap 212b have a temperature (e.g., around 1600° C.) reaching a melting point (e.g., around 1600° C.) of the dielectric material (e.g., $SiO_2$) of the dielectric layer 210, and the melted (also referred to as reflowed) dielectric material fills the gap 212b. In an example, the portions of the dielectric layer 210 around the gap 212c have a temperature (e.g., about 1000° C.) reaching a reflow point (e.g., between about 900° C. to 1100° C. for $SiO_2$), and the reflowed dielectric material fills the gap 212c.

In a particular example, the laser anneal process uses a pulsed laser radiation 218 having a wavelength ranging between about 500 nm to about 600 nm, a pulse duration of about 20 nanoseconds, and a laser pulse energy density of about 20 mJ/cm$^2$.

Figure 2D:
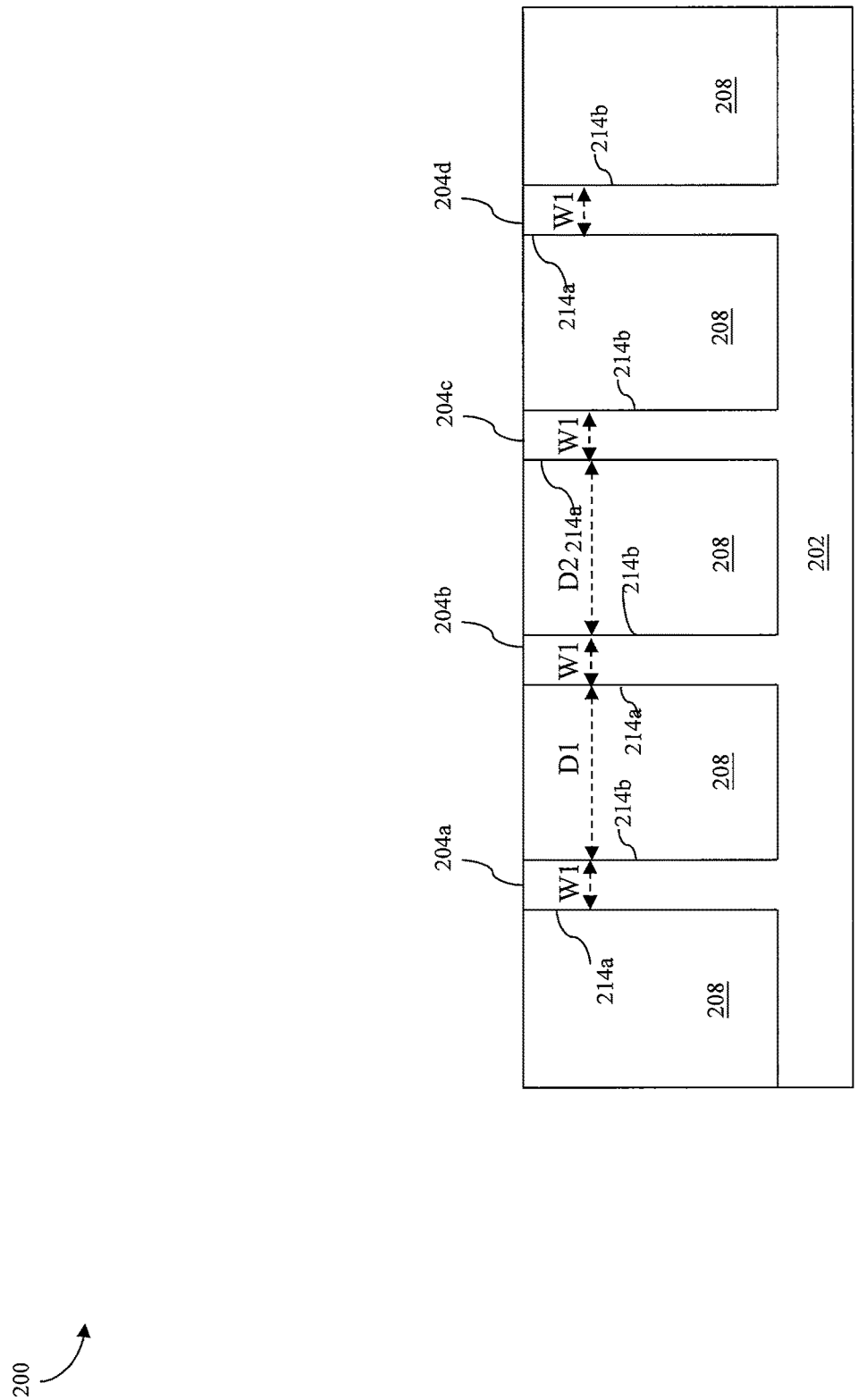

Referring to the example of FIG. 2D, after treating the dielectric layer 210, a planarization process is performed on the dielectric layer. For example, dielectric layer 210 may be planarized (or thinned) by a chemical mechanical polishing (CMP) process. The CMP process planarizes dielectric layer 210 to STI features 208 and so that top surfaces of the fin elements 204a-204d are exposed as illustrated in FIG. 2D. In some embodiments, the CMP process used to form the STI features 208 may also serve to remove the masking element from each of fin elements 204a, 204b, 204c, and 204d. In some embodiments, removal of the masking element may alternately be performed by using a suitable etching process (e.g., dry or wet etching).

Figure 2E:
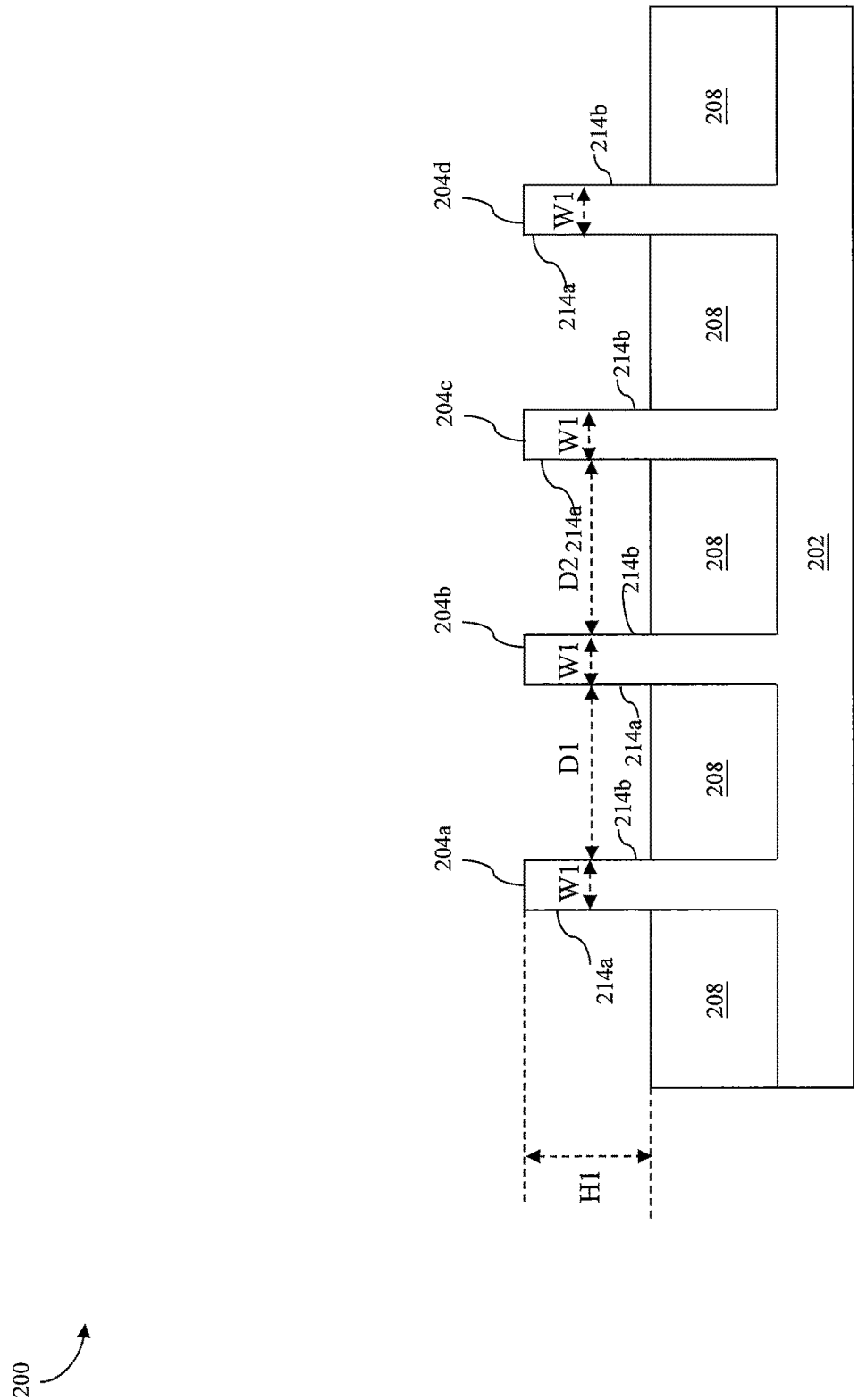

Referring to the example of FIG. 2E, the STI features are recessed to expose the sidewalls of fin elements 204a-204d. As illustrated in FIG. 2E, after the STI features 208 are recessed, fin elements 204a, 204b, 204c, and 204d extend above a top surface of the STI features 208. In some embodiments, the recessing process may include a dry etching process, a wet etching process, and/or a combination thereof. In some embodiments, a recessing depth is controlled (e.g., by controlling an etching time) so as to result in a desired height of the exposed upper portion of the fin elements 204a, 204b, 204c, and 204d, respectively. For example, the exposed upper portions of the fin elements 204a, 204b, 204c, and 204d have a height H1 (e.g., between approximately 50 nm and approximately 100 nm).

Figure 3:
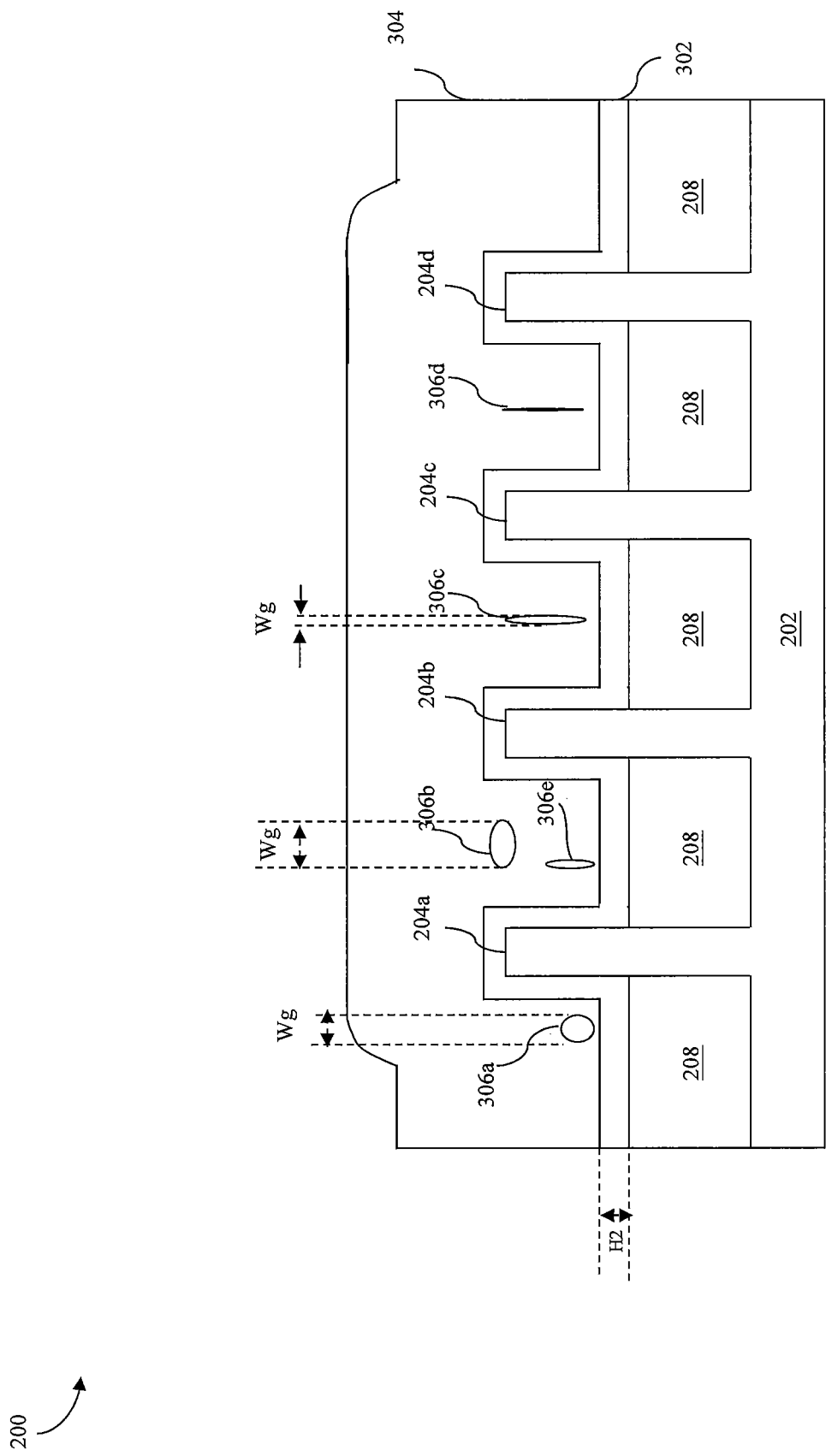
FIG. 3 is a cross-sectional view of a portion of a semiconductor device according to some embodiments.

Referring to FIGS. 1 and 3, the method 100 then proceeds to block 104, where a dielectric layer 302 (also referred to as dummy gate dielectric layer 302) is formed over the substrate. In some embodiments, the dielectric layer 302 is also referred to as a dummy insulating layer or a dummy oxide layer of a dummy gate structure; however, the constraint to an oxide composition is not required. In an embodiment, the dielectric layer 302 also forms an I/O oxide. The dielectric layer 302 may be formed by atomic layer deposition (ALD) and/or other suitable processes.

As illustrated in the examples of FIG. 3, dielectric layer 302 is disposed on the fin elements 204a, 204b, 204c, and 204d and/or on the surface of the STI features 208. In some embodiments, the dielectric layer 302 may include $SiO_2$. However, in other embodiments, a dielectric layer 302 having other compositions is possible, including, for example, silicon nitride, silicon oxynitride, silicon carbon nitride (SiCN), silicon oxycarbonitride (SiOCN), a high-K dielectric material or other suitable material. In some embodiments, the dielectric layer 302 has a height H2 (also referred to as a thickness H2), for example, between about 1 nm and about 10 nm.

In various examples, the dielectric layer 302 may be deposited by a CVD process, a subatmospheric CVD (SACVD) process, a flowable CVD process, an ALD process, a PVD process, or other suitable process. By way of example, the dielectric layer 302 may be used to prevent damage to the fin elements 204a, 204b, 204c, and 204d by subsequent processing (e.g., subsequent formation of a dummy gate electrode layer).

Referring to FIGS. 1 and 3, the method 100 then proceeds to block 106, where an electrode layer 304 (also referred to as dummy gate electrode layer 304) is formed over the dummy gate dielectric layer 302. In some embodiments, the electrode layer 304 includes amorphous silicon or polycrystalline silicon (polysilicon). In some embodiments, the electrode layer 304 may be formed by a CVD process, a Plasma Enhanced Chemical Vapor Deposition (PECVD) process, a PVD process, or other suitable process. In some embodiments, the crystallographic nature of the silicon deposited depends upon the temperature of the deposition process. In some examples, where a CVD process is performed at a deposition temperature of between about 350° C. and about 560° C., the silicon deposited is amorphous silicon. In some examples, the process to form amorphous silicon includes forming a seed layer (e.g., using aminosilanes, diisopropylaminosilane (DIPAS) $SiH_3$—$N(CH$—$(CH_3)_2)_2$). In some examples, the process to form amorphous silicon includes sequential deposition and etch steps. In some examples, where a CVD process is performed with a deposition temperature of between about 560° C. and about 630° C., the silicon deposited is a mixture of amorphous silicon and polysilicon. In some examples, where a CVD process is performed with a deposition temperature greater than about 630° C., the deposited silicon is polycrystalline silicon. In some embodiments, the electrode layer 304 is deposited using silane, disilane, monosilane, nibisukabem silicon tetrachloride, silicon trichloride, silicon dichloride, and other suitable gas as the silicon precursor gas, together with a carrier gas such as nitrogen or hydrogen.

As illustrated in FIG. 3, gaps 306a, 306b, 306c, 306d, and 306e (e.g., air pockets) are formed in the electrode layer 304. Such gaps may cause various issues during subsequent processes. Gaps in the electrode layer 304 may create problems both during semiconductor device fabrication. In some examples, the gaps are formed randomly in the electrode layer 304 and have unpredictable sizes, shapes, locations and population densities, which results in unpredictable and inconsistent post-deposition processing of the electrode layer 304, such as even etching, polishing, and/or annealing. In some examples, the gaps lead to preferential etching and undesirable residues, which result in flaws in subsequently formed features (e.g., the source/drain features and/or gate structures) and therefore affects the quality of performance of the device.

As shown, the electrode layer 304 includes gaps of various sizes. For example, gap 306a has a width Wg of about 4 nm, gap 306b has a width Wg of about 5 nm, gap 306c has a width Wg of about 1 nm, gap 306d has a width Wg of about 0.5 nm, and gap 306e has a width Wg of about 1 nm. In some examples, the gaps having larger widths (e.g., gaps 306a and 306b having a width greater than about 1 nm) may be referred to as voids, and the gaps having smaller widths but larger heights (e.g., gaps 306c, 306d, and 306e having a width equal to or less than about 1 nm and a height greater than about 50% of the fin height H1) may be referred to as seams. In some embodiments, at this stage, in the electrode layer 304, more than half of trenches between fin elements include gaps (e.g. seam and/or void). In an example, about 75% of the trenches have one or more gaps.

Referring to FIGS. 1 and 4A, 4B, 4C, and 4D, the method 100 then proceeds to block 108, where a planarization process is performed to the dummy gate electrode layer so that the dummy gate electrode layer has a planar surface. By way of example, in some embodiments, the planarization process includes deposition steps and etchback steps. Referring to the example of FIG. 4A, an etch stop layer 402 is formed over the electrode layer 304. In some examples, the etch stop layer 402 includes a silicon nitride layer, silicon oxide layer, a silicon oxynitride layer, and/or other materials. The etch stop layer 402 may be formed by plasma-enhanced chemical vapor deposition (PECVD) process and/or other suitable deposition or oxidation processes.

Figure 4A:
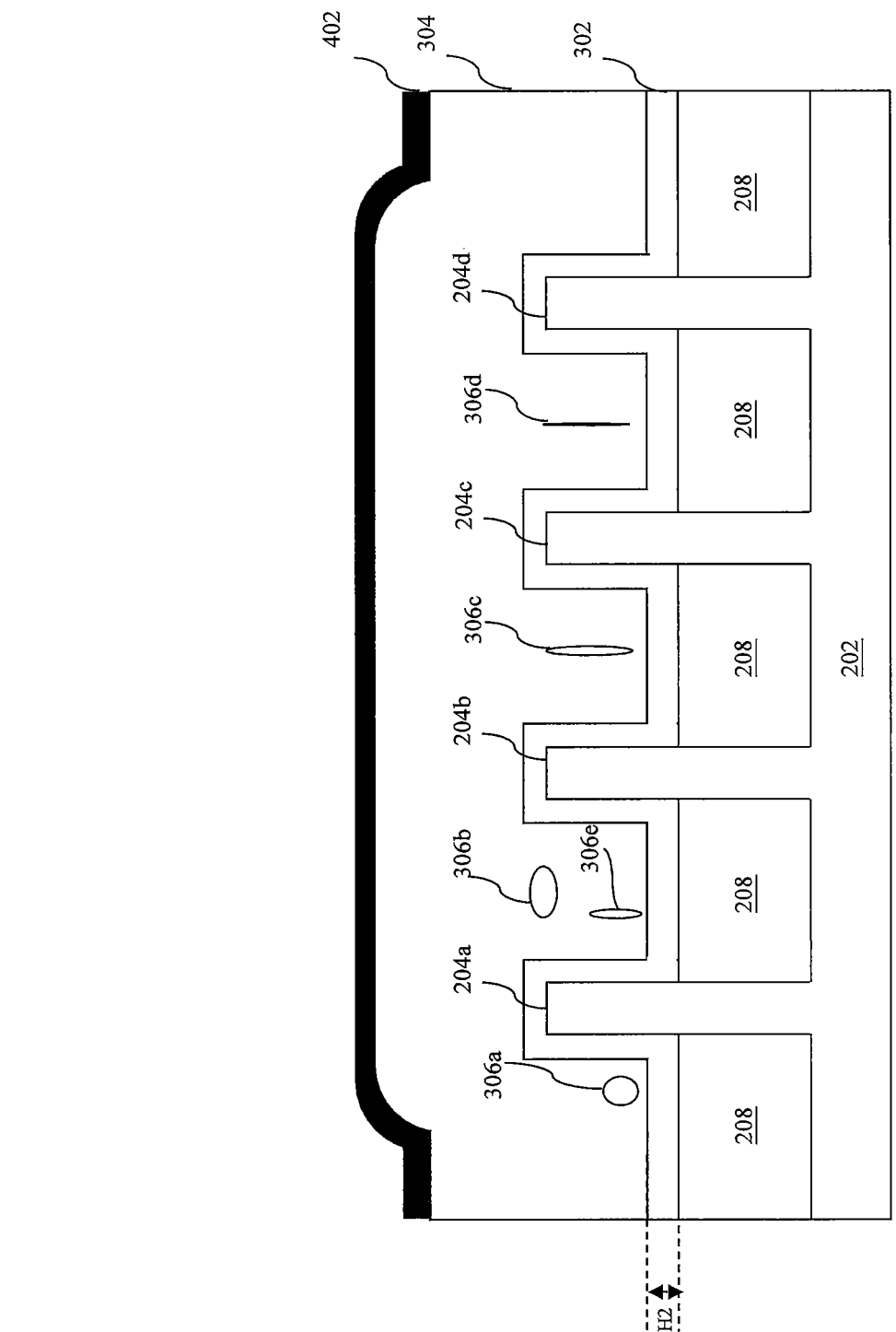
FIGS. 4A, 4B, 4C, and 4D are cross-sectional views of a portion of a semiconductor device according to some embodiments.
Figure 4B:
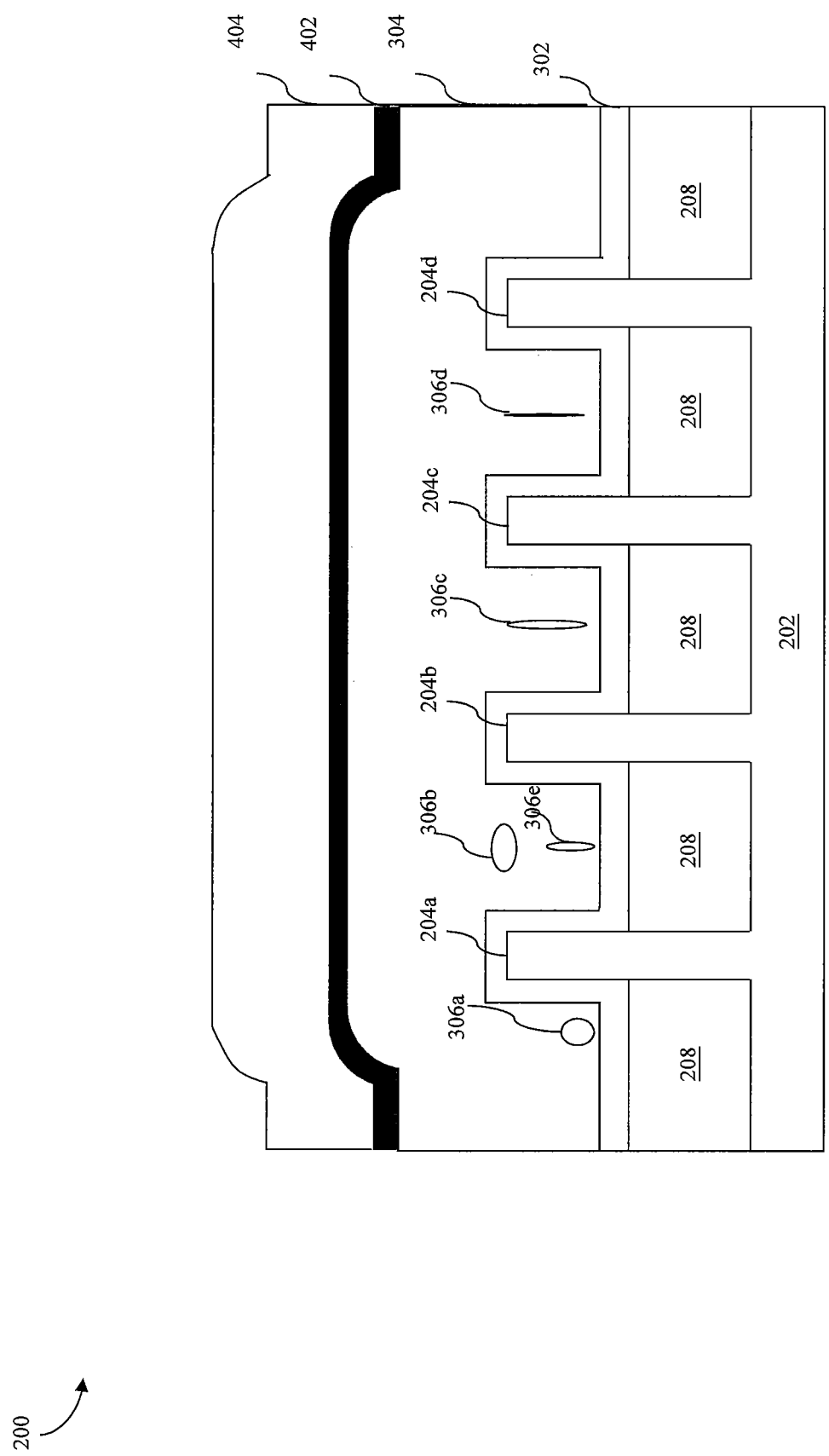

Referring FIG. 4B, in some embodiments, a top layer 404 is formed over the etch stop layer. Exemplary materials of the top layer 404 include $SiO_2$, silicon nitride, silicon oxynitride, fluorine-doped silicate glass (FSG), combinations thereof, and/or other suitable materials. In the example of FIG. 4B, the top layer 404 includes polysilicon. The top layer 404 may be formed by a CVD process, a Plasma Enhanced Chemical Vapor Deposition (PECVD) process, a PVD process, or other suitable process.

Figure 4C:
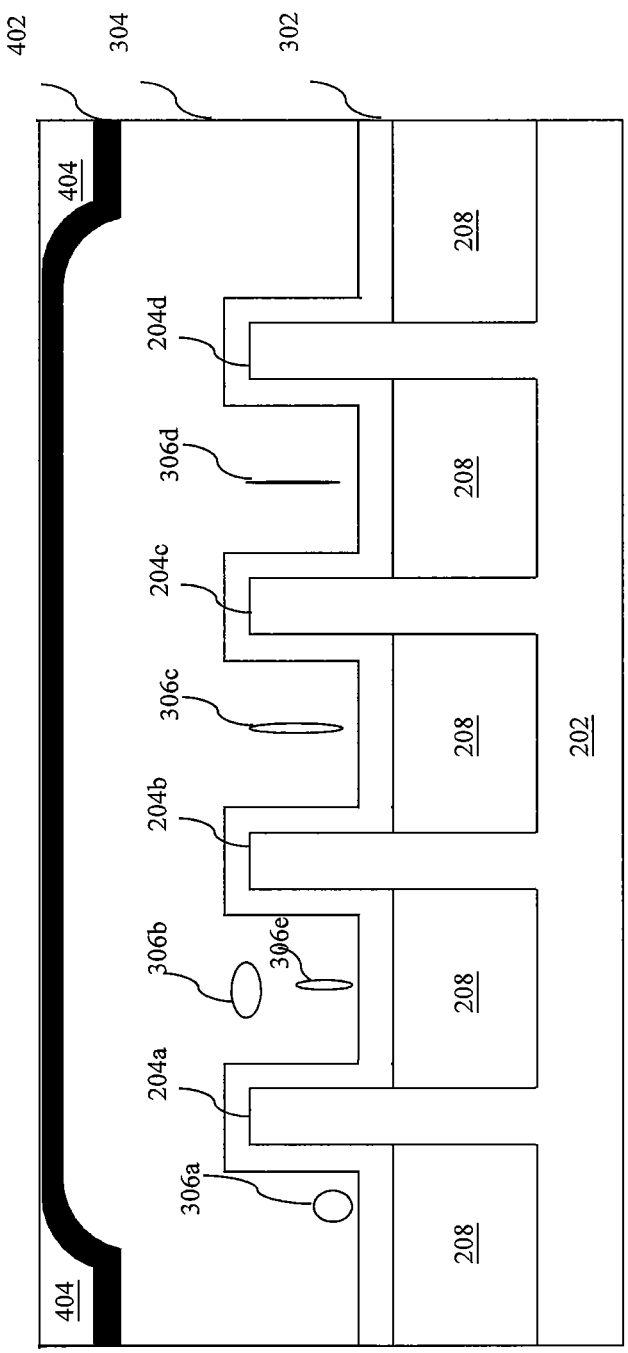

Referring to FIG. 4C, in some embodiments, the top layer 404 and/or the etch stop layer 402 are thinned and planarized, for example by a chemical mechanical polishing (CMP) process. In the example of FIG. 4C, after the CMP process is performed, top surfaces of the top layer 404 are coplanar with a top surface of the etch stop layer 402.

Figure 4D:
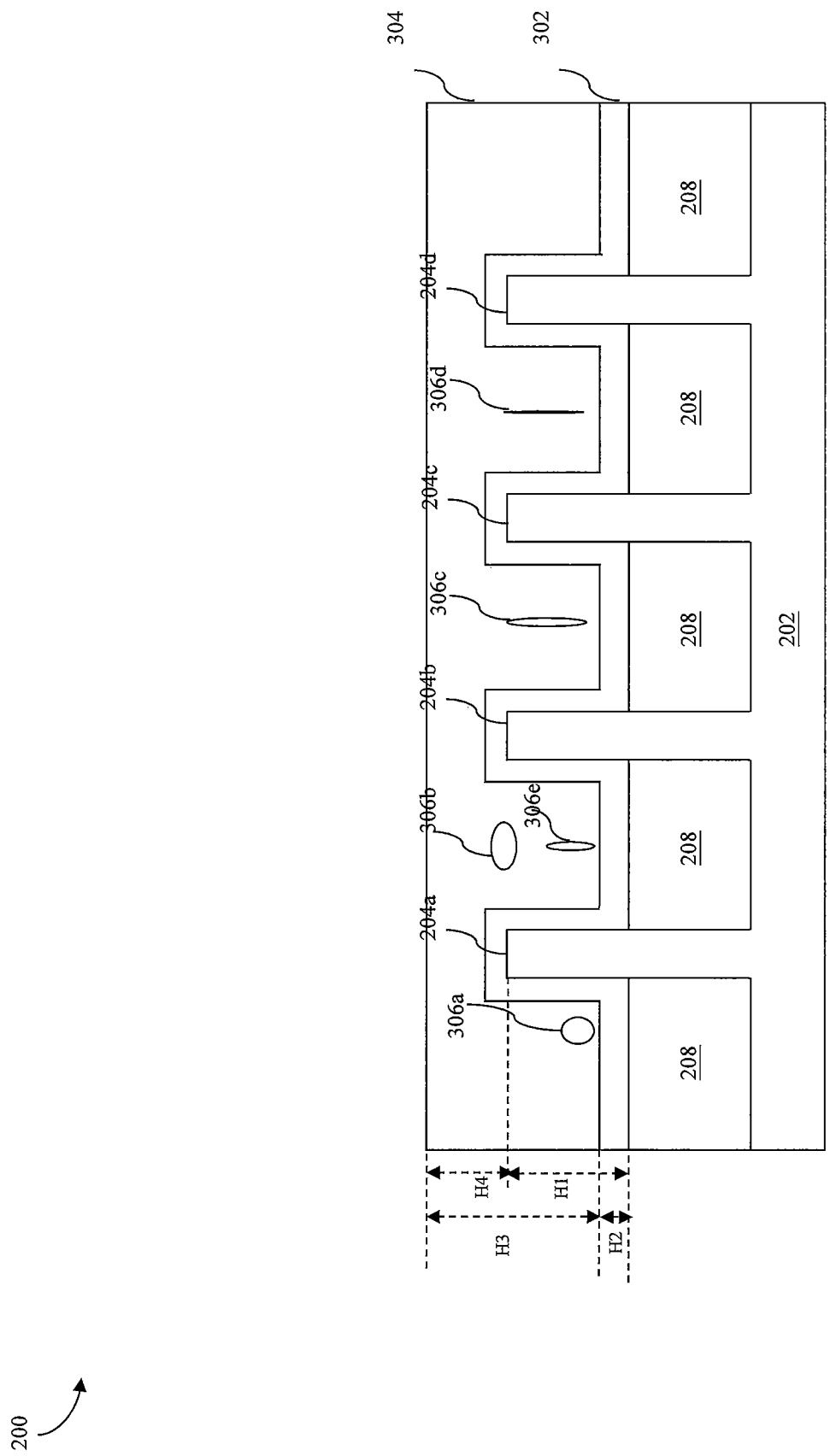

Referring to FIG. 4D, in some embodiments, an etchback process is performed to remove the remaining top layer 404 and the etch stop layer 402. The etchback process has equal etch rates for the remaining top layer 404, the etch stop layer 402, and the electrode layer 304. In some embodiments, the etchback process includes a dry etching process, a wet etching process, and/or a combination thereof. In some embodiments, an etchback process is controlled (e.g., by controlling an etching time and/or an etching rate) so as to result in a desired height of the remaining electrode layer 304.

Figure 5A:
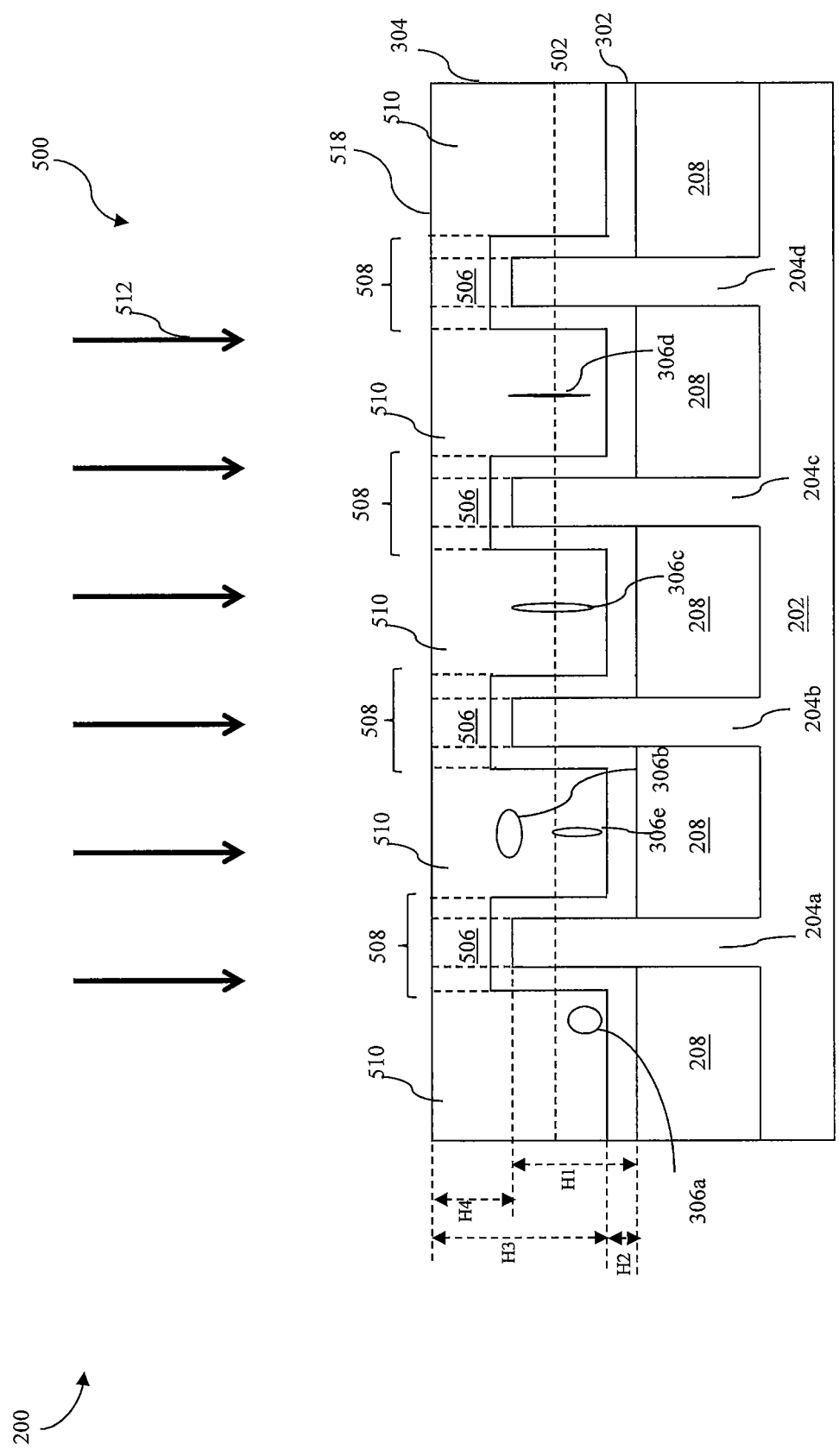
FIGS. 5A, 5C, and 5D are cross-sectional views of a portion of a semiconductor device according to some embodiments.
Figure 5B:
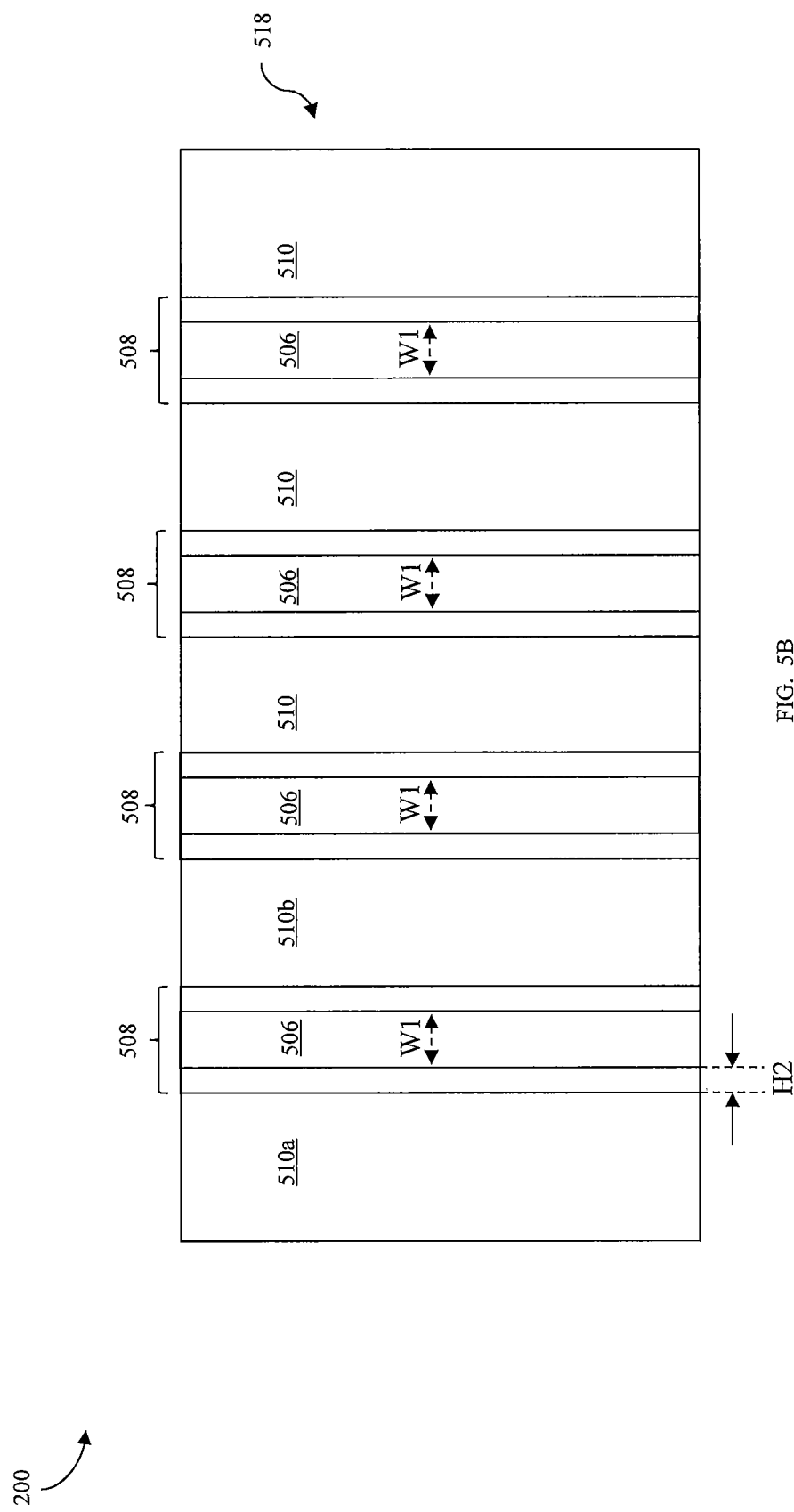
FIG. 5B is a top view of a portion of the semiconductor device of FIG. 5A according to some embodiments.

Referring to FIGS. 1 and 5A, 5B, 5C, and 5D, the method 100 then proceeds to block 110, where a treatment process is performed to remove gaps in the electrode layer 304. FIG. 5A illustrates an example of a cross-sectional view of a device 200 where a treatment process 500 is performed to remove the gaps in the electrode layer 304, and FIG. 5B illustrates an example of a top view of the device 200 of FIG. 5A.

In some embodiments, the treatment process 500 includes a laser anneal process controlled so that the laser anneal process treats the electrode layer 304 without causing damage to the fin elements 204. The laser anneal process has the advantage of localized heating (e.g., heating of a material is concentrated to the immediate neighborhood), which allows precise temperature control to eliminate and/or reduce dopant diffusion to the fin elements 204. In various embodiments, the laser anneal process uses a pulsed laser, and is controlled by tuning laser anneal parameters (e.g., pulse duration (pulse width), pulse energy density, pulse repetition rate, treatment time) so that the gaps 306a, 306b, 306c, 306d, and 306e in the electrode layer 304 are removed without damaging the fin elements.

In some embodiments where the electrode layer 304 includes amorphous silicon, the laser anneal process is controlled by tuning laser anneal parameters so that its thermal budget is sufficiently low to prevent the amorphous silicon of the electrode layer 304 from crystallization (e.g., by keeping the temperature of the amorphous silicon lower than a crystallization temperature of the amorphous silicon). In some examples, the amorphous silicon of the electrode layer 304 is formed by low pressure chemical vapor deposition (LPCVD), and has a crystallization temperature between about 550° C. and about 560° C. In such examples, a temperature of the amorphous silicon of the electrode layer 304 is kept under that crystallization temperature during the laser anneal process to prevent the amorphous silicon of the electrode layer 304 from crystallization. In some examples, a laser anneal process may use a laser having a laser pulse energy density of equal to or less than about 300 mJ/cm$^2$, a laser pulse duration equal to or less than of about 150 ns, and a pulse repetition rate of about 100 times repetition every 900 microsecond (ms).

In some embodiments, the laser anneal parameters of the laser anneal process are determined based on various properties (e.g., dimensions, composition, reflow points, melting points, and absorption spectrum) of the dielectric layer 302, the electrode layer 304, and the fin elements 204a, 204b, 204c, and 204d. In an example where the electrode layer 304 includes an amorphous material, those properties include a crystallization temperature of the amorphous material of the electrode layer 304.

The laser anneal process may use a single pulse or multiple pulses to irradiate a sub-area of a top surface before irradiating the next sub-area of the top surface. In some examples, the laser anneal process includes a single pulse anneal process where a laser beam irradiates a sub-area using a single laser pulse before moving to the next sub-area. In some examples, the laser anneal process includes a multi-pulse anneal process wherein a laser beam irradiates each sub-area with multiple laser pulses (for example, about 10 to 20 laser pulses) before moving to the next sub-area. In some examples, the laser anneal process applies different number of pulses to different sub-areas (e.g., about 10 laser pulses to a first set of sub-areas, and about 20 laser pulses to a second set of sub-areas).

In some embodiments, the laser anneal process removes one or more gaps (e.g., gap 306a) in the electrode layer 304 by inducing thermal expansion and cooling shrinkage of the electrode layer 304. In some examples, the temperature (e.g., between about 450° C. and about 650° C.) of the portions of the electrode layer 304 around the gap 306a is less than a reflow point of the material (e.g., a reflow point of between about 900° C. to 1100° C.) of the electrode layer 304.

In some embodiments, the laser anneal process removes one or more gaps (e.g., gaps 306b and 306c) by filling the one or more gaps by reflowed material (e.g., reflowed amorphous silicon or reflowed polysilicon) of the electrode layer 304. In some examples, the electrode layer 304 includes hydrogenated amorphous silicon (a-Si:H). In such examples, during the laser anneal process, hydrogen is desorbed from the hydrogenated amorphous silicon, and the material of the electrode layer 304 reflows. Such reflow process may then lead to re-bonding and/or reconstruction of bonds (e.g., Si—Si bonds) in the amorphous silicon, thereby removing the one or more gaps. In an example, the portions of the electrode layer 304 around the gap 306b have a temperature (e.g., around 1400° C.) reaching a melting point (e.g., around 1400° C.) of the material of the electrode layer 304, and the melted (also referred to as reflowed) material fills the gap 306b. In an example, the portions of the electrode layer 304 around the gap 306c have temperatures (e.g., about 950° C.) reaching a reflow point (e.g., a temperature between about 900° C. to 1100° C.) lower than the melting point, and the reflowed material fills the gap 306c.

In some embodiments, the laser anneal process is controlled (e.g., by adjusting the energy of the laser anneal using pulse duration, wavelength, pulse repetition rate, treatment time) to tune a reflow depth (e.g., between about 0 and H3), which is the distance between the line 502 and the top surface that receives the laser irradiation. In some examples, an upper portion of the electrode layer 304 above a line 502 reflows, for example, after reaching a temperature equal to or greater than the reflow temperature or the melting point of the electrode layer 304. The reflowed material (e.g., reflowed amorphous silicon) fills the gaps (e.g., gaps 306b, 306c, and 306d) located in the upper portion to remove those gaps. On the other hand, in some examples, a lower portion of the electrode layer 304 below the line 502 is not reflowed (e.g., with a temperature be lower than the reflow temperature). In such lower portion, the laser anneal process may remove the gaps by inducing thermal expansion and cooling shrinkage in the lower portion of the electrode layer 304. Such thermal expansion reduces the widths (and/or heights) of a gap located in the lower portion and brings the surfaces of the gap together. The surfaces of the gap have a high density of dangling bonds, and those dangling bonds on neighboring surfaces of the gap may form reconstructed bonds (e.g., Si—Si bonds), thereby removing the gaps in the lower portion (e.g., gaps 306a and 306e).

In some embodiments, the laser anneal process is controlled so that no portion of the electrode layer 304 is reflowed (melted or sub-melted), and the laser anneal process results in non-melt induced thermal expansion and cooling shrinkage in the entire electrode layer 304. In such embodiments, all gaps in the electrode layer 304 are removed by bond reconstruction (e.g., silicon bond reconstruction).

In some embodiments, the laser anneal process is controlled to have a reflow depth equal to or greater than H4, so that all gaps in the electrode layer 304 are removed by a reflowed material (e.g., reflowed amorphous silicon).

In some embodiments, the laser anneal process is tuned to have a reflow depth greater than H4 without damaging the fin elements based on various properties (e.g., reflow temperatures, melting points, absorption spectrum) of the dielectric layer 302, electrode layer 304, and fin elements 204a, 204b, 204c, and 204d. In some embodiments, the laser wavelength is tuned based on the absorption coefficient of the various materials. For example, at a certain wavelength of the laser (e.g., between about 450 nm and about 600 nm), the absorption coefficient of the material of the electrode layer 304 (e.g., amorphous silicon) is greater than that of the material of the fin elements (e.g., crystalline silicon) (e.g., by more than one order of magnitude). In such examples, by using a laser at a particular wavelength (e.g., about 500 nm), during the laser anneal process, the fin elements remain substantially the same and have a temperature lower than the fin elements' reflow temperature.

In some embodiments, the laser anneal process applies different laser energies to different areas of the electrode layer 304. In some embodiments, the laser energy is adjusted for different areas based on the locations of the fin elements 204a, 204b, 204c, and 204d, where the portions 508 of the electrode layer 304 disposed above the fin elements have a height less than the height H3 of the portions 510 of the electrode layer 304. In some examples, the laser anneal process applies a first laser energy to a top surface of the portions 508 to remove the gaps in the portions 508, and applies a second laser energy greater than the first laser energy to a top surface of the portions 510 to remove the gaps in portions 510. In some embodiments, the laser anneal process includes a first laser anneal step using a first set of laser anneal parameters (e.g., a pulse duration of about 10 ns) to a top surface of portions 508, and a second laser anneal step using a second set of laser anneal parameters (e.g., a pulse duration of about 50 ns) to a top surface of portions 510.

In some embodiments, the laser anneal process is tuned based on the distribution of the gaps. In some examples, as shown in the example of FIG. 5A, the gaps are mainly formed in portions 510 (e.g., in the trenches between adjacent fin elements), and there are significantly less gaps or almost no gaps formed in portions 508. Referring to FIG. 5B, in such examples, the laser anneal process is tuned so that the laser beam irradiates a top surface of portions 510, but not does not irradiate a top surface of portions 508. For example, after a portion 510a of the portions 510 is scanned by a the laser beam, the substrate is stepped a distance that is equal to or greater than a width of a portion 508, so that another portion 510b of the portions 510 is scanned by the laser beam, while the portion 508 disposed between the portions 510a and 510b is not scanned.

In some embodiments, the laser anneal process of the treatment process 500 is performed using a laser having wavelength between about 300 nm to about 600 nm. The laser pulse duration is less than 200 ns (e.g., between about 2 ns and about 200 ns, about 20 ns, or about 150 ns). The laser pulse energy density is between about 1 mJ/cm$^2$ and 10 J/cm$^2$ (e.g., 300 mJ/cm$^2$). The laser type may be a solid-state type or an excimer type. In a particular example, the laser anneal process uses a laser having a wavelength ranging between about 500 nm to about 600 nm, a pulse duration of about 150 nanoseconds, and a laser pulse energy density of about 100 mJ/cm$^2$. In some embodiments, the laser anneal parameters (e.g., wavelength, pulse duration (pulse width), pulse energy density, pulse repetition rate, treatment time, or a combination thereof) of the laser anneal process of the treatment process 500 are different from the laser anneal parameters of the treatment process 216 applied to the dielectric layer 210 as discussed above with reference to FIG. 2C. For example, the laser radiation 512 has a wavelength different from the wavelength of the laser radiation 218 discussed above with reference to FIG. 2C.

In some embodiments, the treatment process 500 includes a thermal treatment process performed to remove gaps in the electrode layer 304. A thermal profile (including for example, the peak temperature and anneal duration) of the thermal treatment process may determine whether amorphous silicon of the electrode layer 304 may keep the amorphous structure. The thermal profile may be determined based on various properties (e.g., dimensions, composition, reflow points, melting points, and absorption spectrum) of the dielectric layer 302, the electrode layer 304, and the fin elements 204a, 204b, 204c, and 204d, and a crystallization temperature of the amorphous silicon of the electrode layer 304. In some examples, the thermal treatment process may remove the gaps by inducing thermal expansion and cooling shrinkage of the electrode layer 304. In those examples, the surfaces of the gap are brought together by the thermal expansion, where a high density of dangling bonds on neighboring surfaces of the gap form reconstructed bonds (e.g., Si—Si bonds), thereby removing the gaps. In some examples, the thermal treatment process causes the amorphous silicon of the electrode layer 304 to reflow, and the gaps are removed by the reflowed amorphous silicon.

In some embodiments, the thermal profile of the thermal treatment process of the treatment process 500 is controlled so that the thermal budget of the thermal treatment process is sufficiently low to prevent the amorphous silicon of the electrode layer 304 from crystallization. In some embodiments, the thermal treatment process includes a rapid thermal anneal (RTA) process. In some examples, the RTA process includes an annealing temperature, which is defined as the peak temperature in the thermal profile of the thermal treatment, between about 650° C. to about 750° C. In some examples, the RTA process has an annealing duration between about 0.5 seconds to about 240 seconds. In some examples, the RTA process has an annealing temperature of about 750° C., and an annealing duration of about 0.5 seconds. In some examples, the RTA process has an annealing temperature of about 650° C., and an annealing duration of about 240 seconds. In some embodiments, the thermal treatment process includes a furnace thermal treatment process. The furnace thermal treatment process may include an annealing temperature between about 550° C. to about 630° C., and has an annealing duration between about 0.5 hours to about 10 hours. In some examples, the furnace thermal treatment process bas an annealing temperature of about 550° C. and an annealing duration of about 10 hours. In some examples, the furnace thermal treatment process bas an annealing temperature of about 630° C. and an annealing duration of about 0.5 hours. In some embodiments, after such thermal treatment process is performed, the amorphous silicon in the electrode layer 304 remains amorphous, and at least about 75% of the gaps are removed. In an example, the thermal treatment process reduces a gapped trench ratio (defined by a ratio between the number of trenches having gaps and the total number of trenches) by more than about 75% (e.g., reduced from about 75% to about 18.5%).

In some embodiments, the thermal profile of the thermal treatment process is controlled such that the thermal treatment process crystalizes the amorphous silicon of the electrode layer 304. In some examples, such thermal treatment process includes an RTA process having an annealing temperature higher than about 750° C. (e.g., between about 755° C. and about 1400° C.) and an annealing duration greater than about 5 seconds. In some examples, such thermal treatment process includes a furnace thermal treatment process having an annealing temperature greater than about 630° C. (e.g., between about 635° C. and about 1200° C.) and an annealing duration greater than about one hour. In some examples, such thermal treatment process includes a laser treatment process with a radiation wave length between about 300 nm and about 600 nm, a pulse energy density greater than about 350 mJ/cm², a pulse duration greater than about 150 ns, and a pulse number equal to or greater than one. In some embodiments, after the thermal treatment process is performed, the amorphous silicon is crystallized to form polycrystalline silicon, and almost all gaps may be removed. In an example, the thermal treatment process reduces the gapped trench ratio by about 100% (e.g., from about 75% to about 0%).

In some embodiments, a normalized silicon reflectivity is used to determine whether the amorphous silicon of the electrode layer 304 has crystallized during the treatment process 500. A normalized reflectivity at time t1 ($R_{norm}$(t1)) is defined as [R(t1)−R(t0)]/R(t0), where silicon reflectivity R(t1) and R(t0) of the electrode layer 304 are measured at times t1 and t0 by a reflectometer, where the time t0 is before the treatment process 500 starts, and the time t1 is after the treatment process 500 starts. In an example where the amorphous silicon of the electrode layer 304 remains amorphous during the treatment process 500, the $R_{norm}$(t1) remains less than about 0.1 during the treatment process 500, where the time t1 is any moment during the treatment process 500.

Figure 5C:
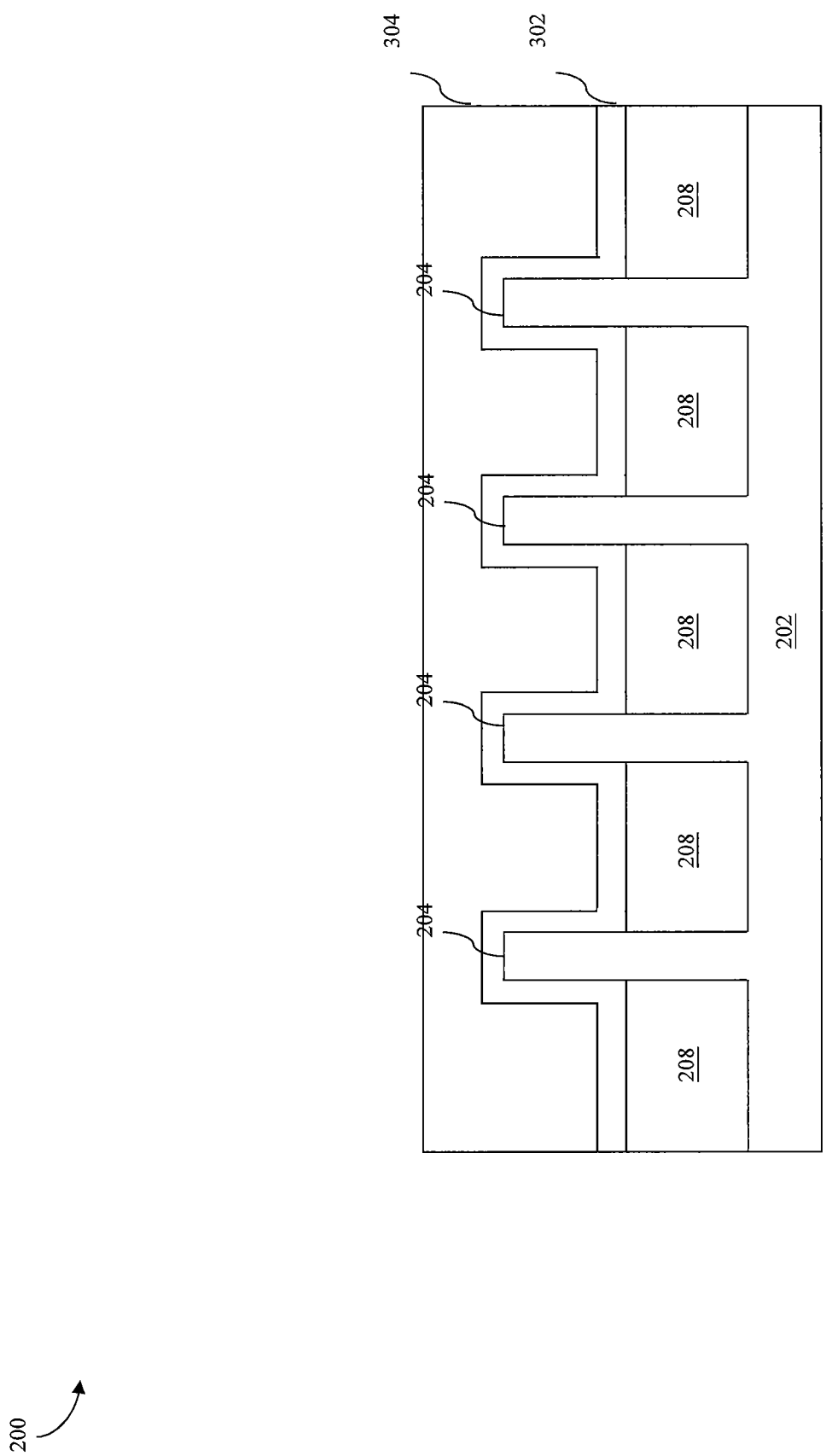
Figure 5D:
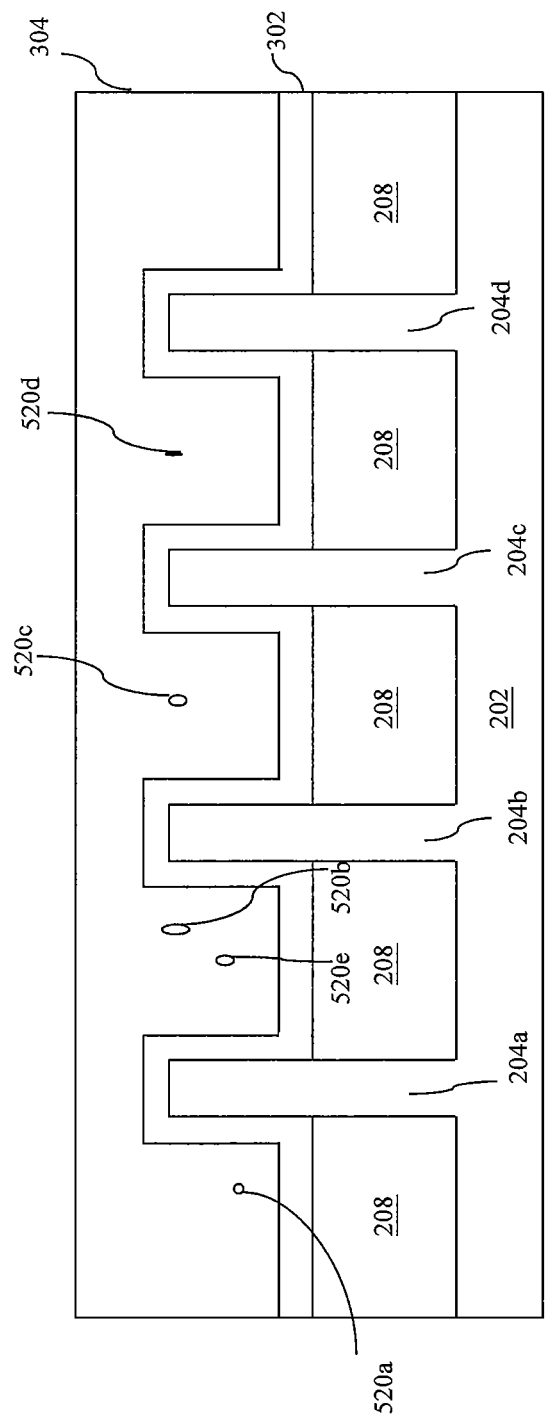
Figure 5D:
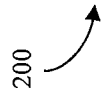

Referring to FIG. 5C, illustrated is an example of the device 200 after the treatment process 500 is performed, where the electrode layer 304 does not include any gaps. Referring to FIG. 5D, illustrated is an example of the device 200 after the treatment process 500 is performed, where the treatment process 500 reduces the sizes of the gaps 306a, 306b, 306c, 306d, and 306e to form air pockets 520a, 520b, 520c, 520d, and 520e respectively. In some examples, an air pocket is referred to as a pit if the air pocket has a size sufficiently small such that the air pocket does not affect yield. In an example, a pit has a height (e.g., 1 nm) that is equal to or less than about 1% of the fin height H1 (e.g., 100 nm) and a width of less than about 5 nm. A gap may be considered to have been removed by the treatment process 500 where a pit is formed from the gap. In the examples of FIG. 5D, gaps 306a, 306b, 306c, 306d, and 306e have been removed by the treatment process 500, as the resulting air pockets 520a, 520b, 520c, 520d, and 520e (also referred to as pits 520a, 520b, 520c, 520d, and 520e) have size sufficiently small such that they do not affect yield.

It is noted that while in the examples of FIGS. 5A, 5B, 5C, and 5D, the treatment process 500 to remove gaps in the electrode layer 304 is performed at block 110 after block 108 has been performed to planarize the electrode layer 304, in some embodiments, the treatment process 500 may be performed prior to block 108. In such embodiments, the treatment process 500 is performed to remove gaps in the electrode layer 304 after depositing the electrode layer 304, but prior to forming the etch stop layer 402 at block 108.

Figure 6A:
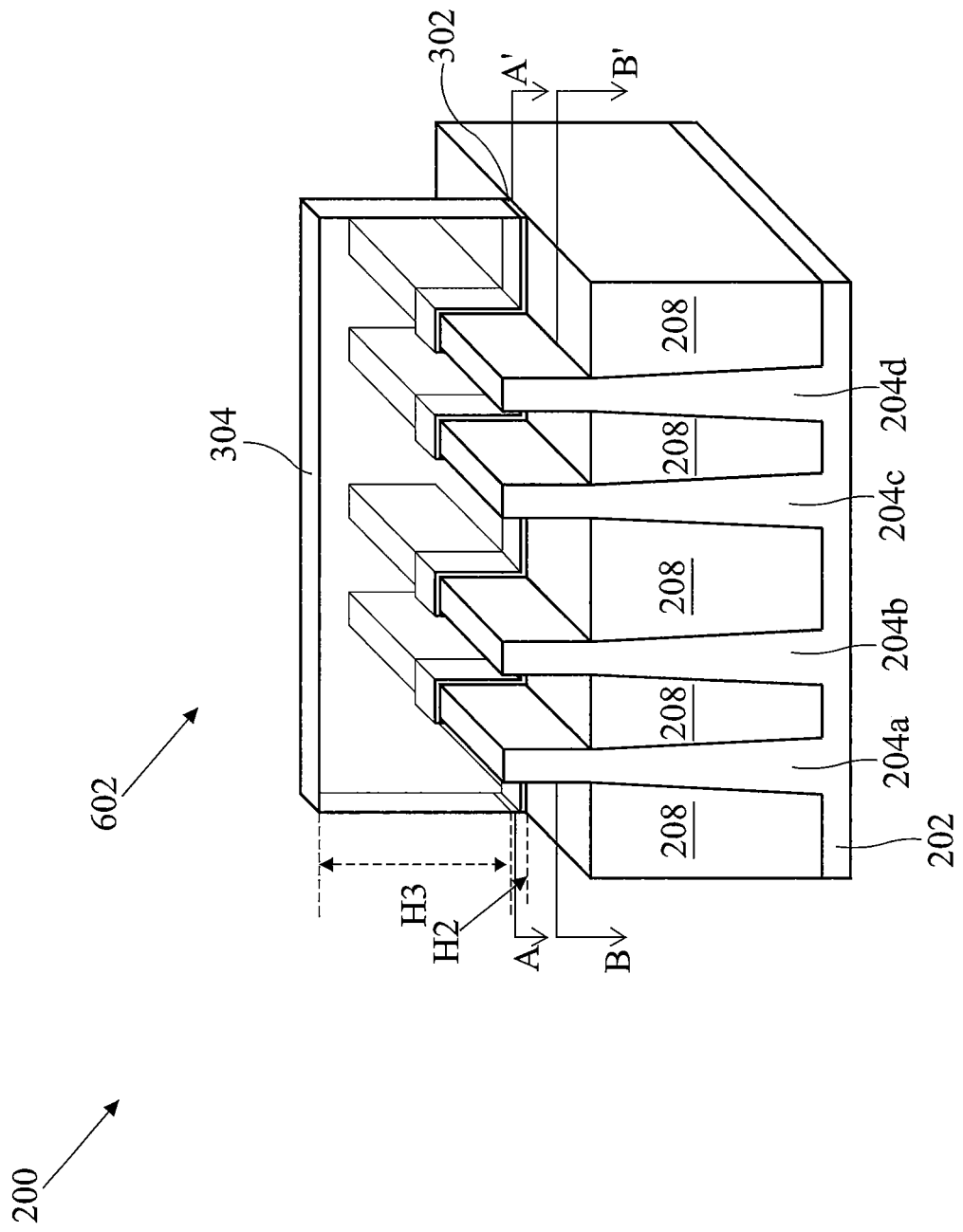
FIG. 6A is an isometric view of a portion of a semiconductor device according to some embodiments.
Figure 6B:
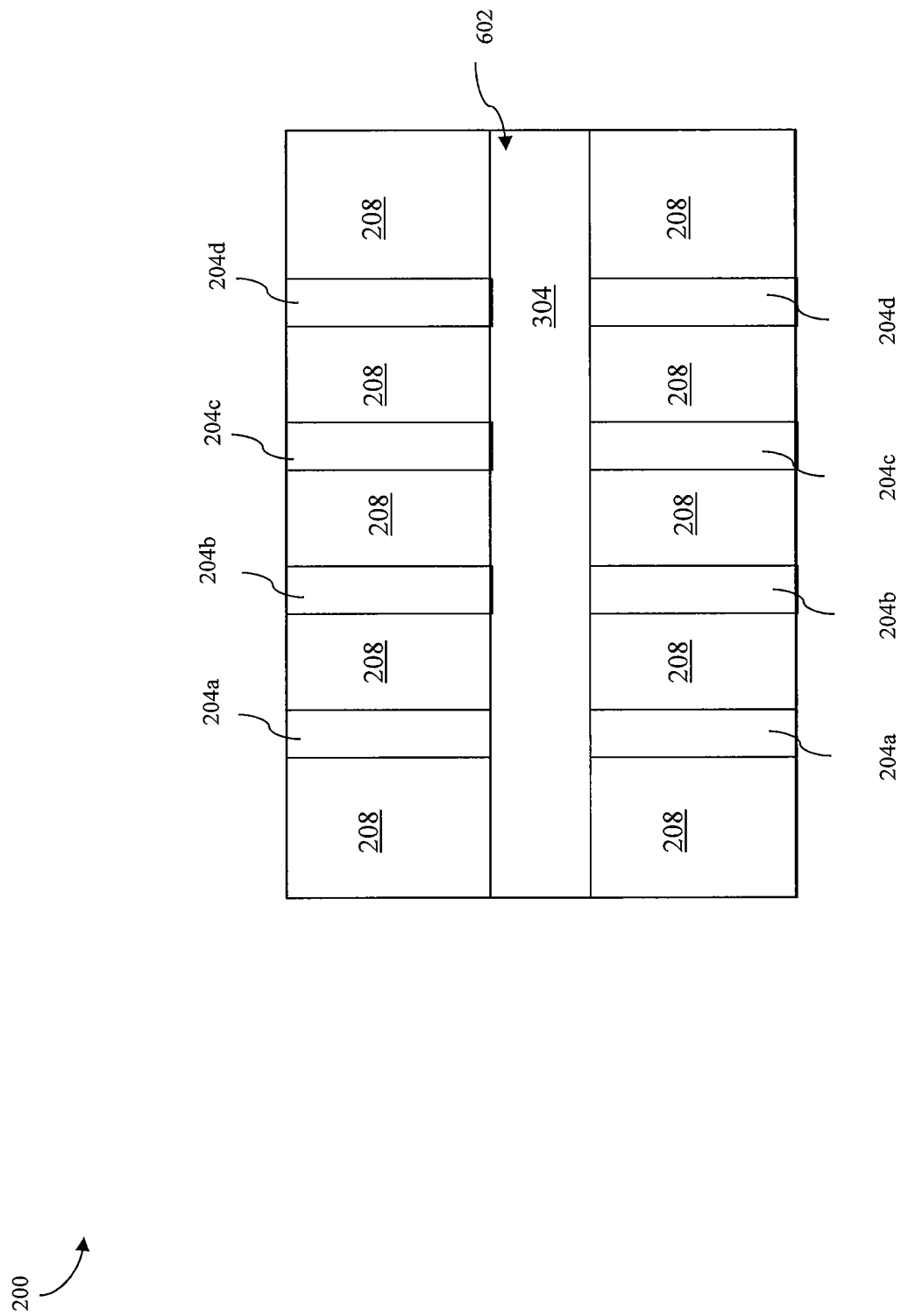
FIG. 6B is a top view of a portion of a semiconductor device of FIG. 6A according to some embodiments.

Referring to FIGS. 1, 6A, and 6B, the method 100 then proceeds to block 112, where a dummy gate structure 602 is formed by patterning and etching the dummy gate dielectric layer 302 and the dummy gate electrode layer 304. In the example of FIGS. 6A and 6B, a dummy gate structure 602 is formed over the substrate 202 and is at least partially disposed over the fin elements 204a, 204b, 204c, and 204d respectively. The dummy gate structure 602 includes the dielectric layer 302 and the electrode layer 304. The portion of the fin elements 204a, 204b, 204c, and 204d directly underlying the dummy gate structure 602 may be referred to as the channel regions. The dummy gate structure 602 may also define source/drain regions, for example, as the regions of the respective fin elements adjacent to and on opposing sides of the channel regions of the dummy gate structure 602.

Various steps such as layer deposition (e.g., of a hard mask over the dummy gate electrode layer 304), patterning, as well as other suitable steps, are used to form the dummy gate structure 602. Exemplary layer deposition processes includes CVD (including both low-pressure CVD and plasma-enhanced CVD), PVD, ALD, thermal oxidation, e-beam evaporation, or other suitable deposition techniques, or combinations thereof. The patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof.

In some embodiments, etching processes are performed to remove the electrode layer 304 and the dielectric layer 302 in the source/drain regions after the patterning process to form the dummy gate structure 602. The etching processes may include dry etching (e.g., RIE etching), wet etching, and/or other etching methods. In some examples where the electrode layer 304 includes gaps that cause preferential etching, after the etching processes, there are residues of the electrode layer 304 and the dielectric layer 302 in the source/drain regions (e.g., on the top surfaces of the STI 208 and fin elements 204a, 204b, 204c, and 204d in the source/drain regions). Such residues may cause defect in subsequently formed source/drain features. Therefore, by removing gaps in the electrode layer 304 at block 110, residues in the channel regions after the etching processes are reduced or removed, which help reduce defects in subsequent formed gate structures.

Referring to FIGS. 1, 7A, 7B, and 7C, the method 100 then proceeds to block 114, where source/drain features and an inter-level dielectric layer are formed in the source/drain regions adjacent to the dummy gate structure. Block 114 of the method 100 includes forming source/drain features by performing an epitaxial growth process on top surfaces of the fin elements. Referring to the example of FIG. 7A, the source/drain features 702 including a semiconductor material are formed by epitaxially growing a semiconductor material on the fin elements 204a, 204b, 204c, and 204d respectively. In various embodiments, the grown semiconductor material of source/drain features 204a, 204b, 204c, and 204d include Ge, Si, GaAs, AlGaAs, SiGe, GaAsP, SiP, or other suitable material. In some embodiments, the epitaxially grown material of source/drain features 702 is in-situ doped during the epitaxial process. In some embodiments, the epitaxially grown material of source/drain features 702 is not in-situ doped, and, for example, instead an implantation process is performed to dope the epitaxially grown material of source/drain features 702.

In an embodiment, the fin elements 204a, 204b, 204c, and 204d are silicon and the epitaxially grown material of source/drain features 702 also is silicon. In some embodiments, the fin elements 204a, 204b, 204c, and 204d and the material of the source/drain features 702 may comprise a similar material, but be differently doped. In some embodiments, the fin elements 204a, 204b, 204c, and 204d include a first semiconductor material, and the epitaxially grown material of source/drain features 702 includes a second semiconductor different than the first semiconductor material.

In various embodiments, the source/drain features 702 may be grown in different processes or the same processes and/or include different materials and/or dopants or dopant profiles. In an embodiment, the epitaxially grown material of source/drain features 702 is silicon being doped with phosphorous. In a further embodiment, the phosphorous dopant concentration may be between approximately $5\times10^{20}$ and approximately $6\times10^{21}$ atoms per cm$^3$. The epitaxially grown material of source/drain features 702 may be alternatively suitably doped to include arsenic, antimony, or other N-type donor material.

Figure 7A:
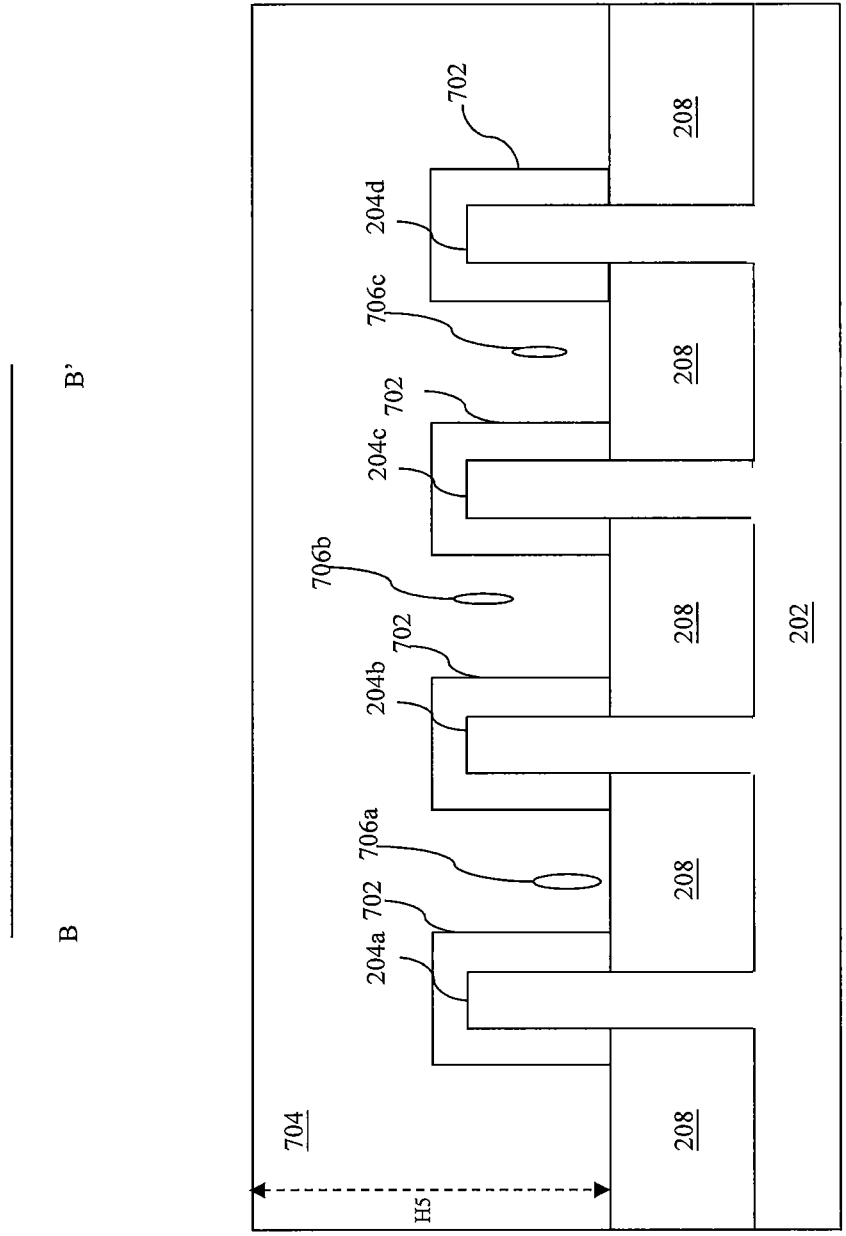
Figure 7B:
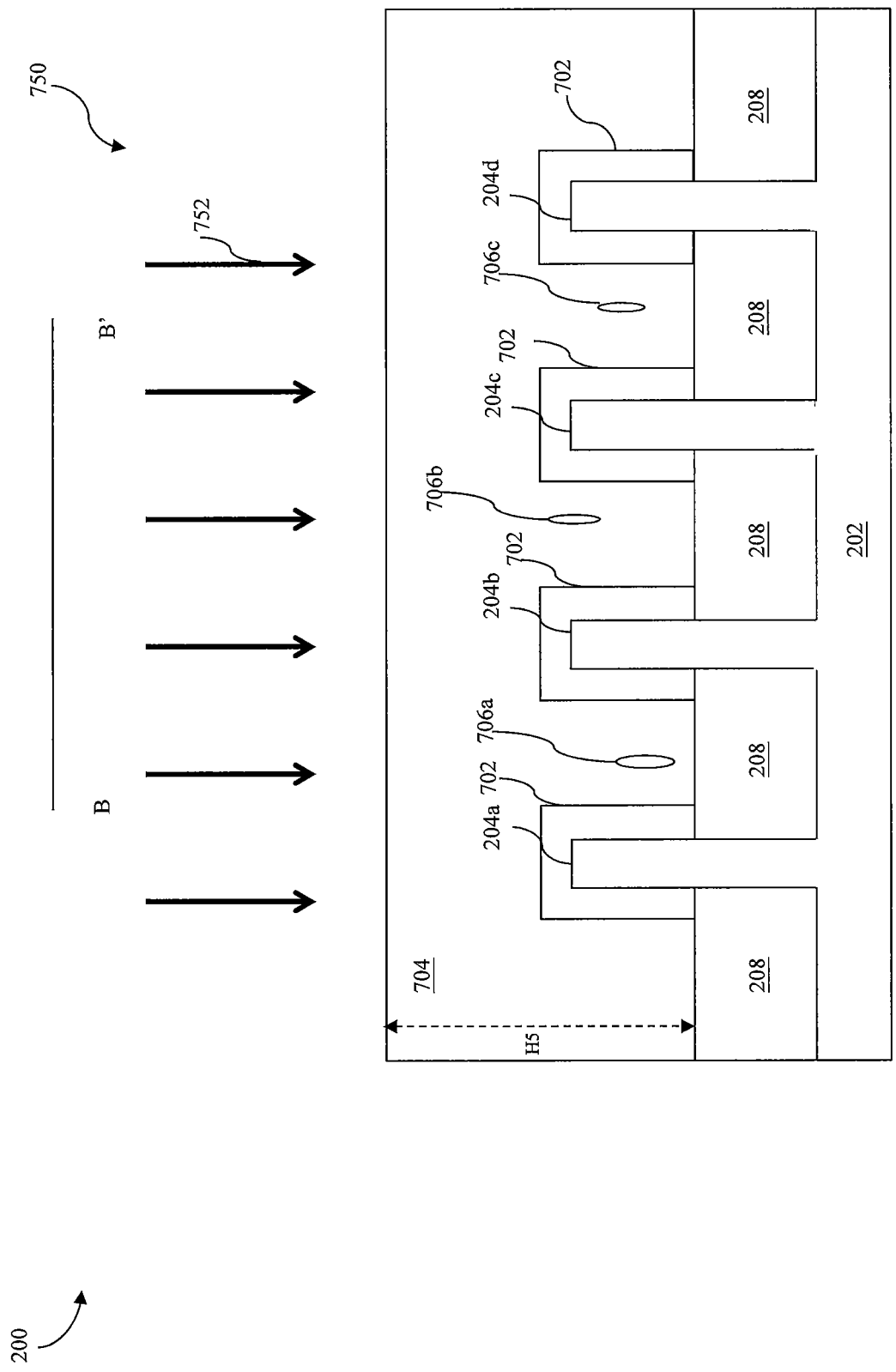

In some embodiments, block 114 continues to include forming of an inter-level dielectric (ILD) layer. Referring to FIG. 7A, in some embodiments, inter-level dielectric (ILD) layer 704 is formed over the source/drain features 702 in the source/drain region. Exemplary materials of the ILD layer 704 include, for example, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), SiO$_2$, silicon nitride, silicon oxynitride, silicon carbon nitride (SiCN), silicon oxycarbonitride (SiOCN), and/or other suitable dielectric materials. The ILD layer 704 may include a plurality of layers. The ILD layer 704 may be deposited by a PECVD process or other suitable deposition technique.

As illustrated in FIG. 7A, in some embodiments, gaps (e.g., air pockets) 706a, 706b, 706c disposed between adjacent fin elements are formed in the ILD layer 704. Gaps in the ILD layer 704 may create problems both during semiconductor device fabrication and in the finished devices. In some examples, the gaps are formed randomly in the ILD layer 704 and have unpredictable sizes, shapes, locations and population densities, which results in unpredictable and inconsistent post-deposition processing of the ILD layer 704, such as even etching, polishing, and/or annealing. In some examples, the gaps in the ILD layer 704 in the finished devices create variations in the dielectric qualities of gaps and trenches in device structures. This can result in uneven and inferior device performance due to electrical crosstalk, charge leakage, and even shorting within and between device elements.

In some embodiments, block 114 continues to include performing a treatment process to the ILD layer. Referring to the example of FIG. 7B, a treatment process 750 is performed to the semiconductor device 200 to improve the quality of the ILD layer 704 by removing the gaps 706a, 706b, and 706c. In some embodiments, the treatment process 750 includes a laser anneal process irradiating the ILD layer 704 with laser radiation 752. In some embodiments where the electrode layer 304 includes amorphous silicon, the laser anneal process of the treatment process 750 is controlled so that its thermal budget is sufficiently low to prevent the amorphous silicon of the electrode layer 304 from crystallization (e.g., by keeping the temperature of the amorphous silicon lower than a crystallization temperature of the amorphous silicon). In some examples, the amorphous silicon of the electrode layer 304 is formed by low pressure chemical vapor deposition (LPCVD), and its temperature is kept below a crystallization temperature of 550° C. during the treatment process 750.

In various embodiments, the laser anneal process of the treatment process 750 uses a pulsed laser, and is controlled by tuning laser anneal parameters (e.g., wavelength, pulse duration (pulse width), pulse energy density, pulse numbers, shape and size of a cross-sectional area of a laser beam, the number of laser anneal stages, radiation areas), so that the gaps 706a, 706b, and 706c in the ILD layer 704 are removed without damaging the fin elements and/or source/drain features 702. In some embodiments, the laser anneal parameters are determined based on various properties of the ILD layer 704 (e.g., the thickness H5, the composition, the absorption spectrum, the melting point), the fin elements 204a, 204b, 204c, and 204d (e.g., the width w1, the composition, the absorption spectrum, the melting point), and the source/drain feature 702 (e.g., the dimensions, the composition, the absorption spectrum, the melting point).

In some embodiments, the laser anneal process removes one or more gaps (e.g., gap 706a) in the ILD layer 704 by inducing thermal expansion and cooling shrinkage of the ILD layer 704. In some examples, the temperature (e.g., between about 450° C. and about 650° C.) of the portions of the ILD layer 704 around the gap 706a is less than a reflow point of the material (e.g., a reflow point of between about 900° C. to 1100° C.) of the ILD layer 704.

In some embodiments, the treatment process 750 removes one or more gaps (e.g., gaps 706b and 706c) by filling the one or more gaps by reflowed material of the ILD layer 704. In an example, the portions of the ILD layer 704 around the gap 706b have a temperature (e.g., around 1600° C.) reaching a melting point (e.g., around 1600° C.) of the material of the electrode layer 304, and the melted (also referred to as reflowed) material fills the gap 706b. In an example, the portions of the ILD layer 704 around the gap 706c have temperatures (e.g., about 1000° C.) reaching a reflow point (e.g., a temperature between about 900° C. to 1100° C.) lower than the melting point, and the reflowed material fills the gap 706c.

In a particular example, the treatment process 750 uses a laser radiation 752 having a wavelength ranging between about 500 nm to about 600 nm, a pulse duration of about 30 nanoseconds, a laser pulse energy density of about 50 mJ/cm$^2$, and a pulse number of 40. In some embodiments, the laser anneal parameters of the treatment process 750 are different from the laser anneal parameters of the treatment process 216 applied to the dielectric layer 210 as discussed above with reference to FIG. 2C, and the laser anneal parameters of the treatment process 500 applied to the electrode layer 304 as discussed above with reference to FIG. 5A. For example, the laser radiation 752 has a laser pulse duration different from both the laser pulse durations of the laser radiation 218 discussed above with reference to FIG. 2C and the laser radiation 512 discussed above with reference to FIG. 5A.

Referring to FIG. 7C, illustrated is an example of the device 200 after the treatment process 750 is performed, where the ILD layer 704 does not include any gaps.

Figure 8B:
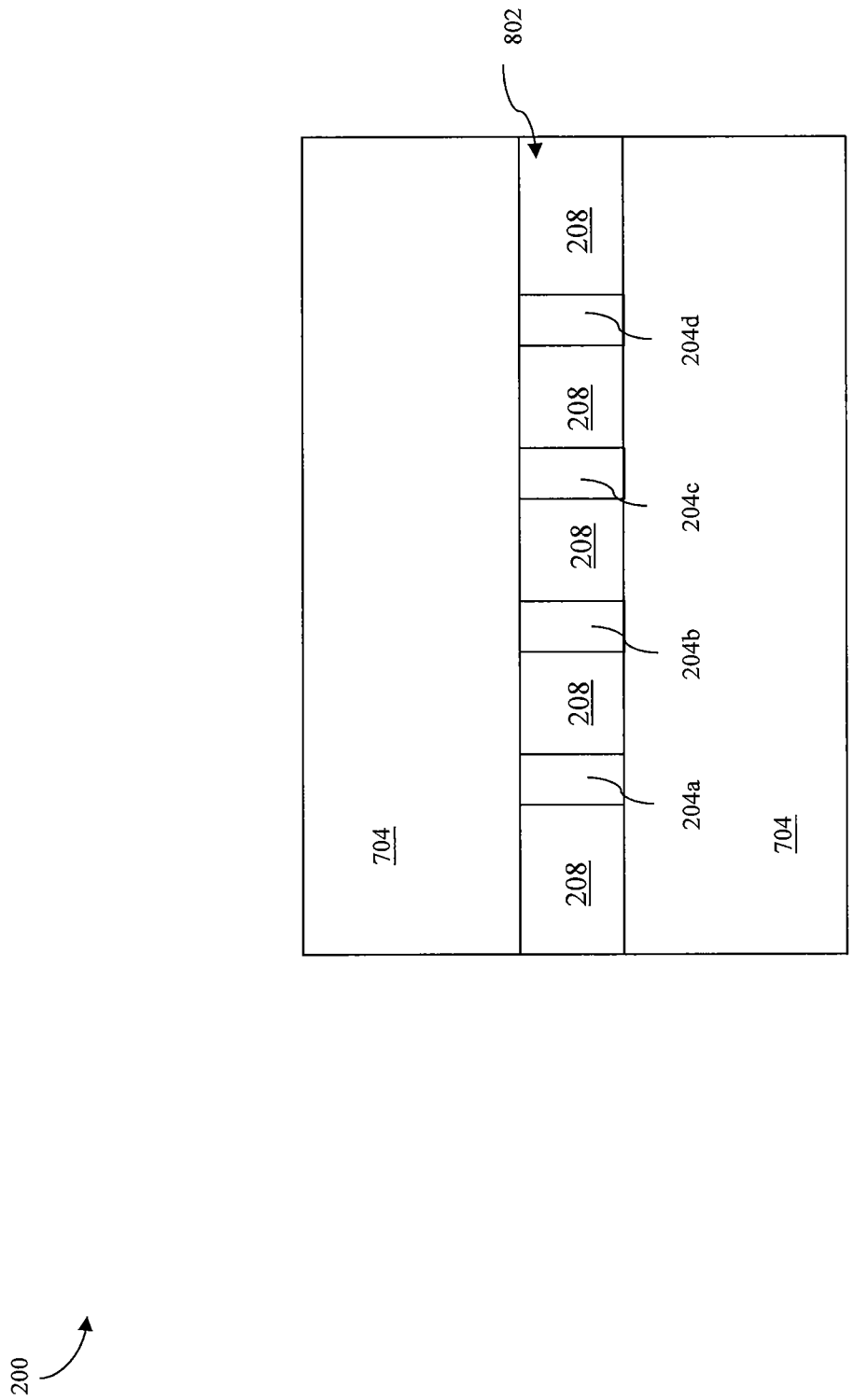
FIG. 8B is a top view of a portion of a semiconductor device of FIG. 8A according to some embodiments.

Referring to FIGS. 1, 8A, 8B, 8C, and 8D, the method 100 then proceeds to block 116, where the dummy gate structure 602 is removed. Referring to FIGS. 8A and 8B, illustrated therein are a cross-sectional view of the device 200 along the A-A' line of FIG. 6A and a top view of the device 200 of FIG. 8A respectively, where both the dielectric layer 302 and the electrode layer 304 of the previously formed dummy gate structure 602 are removed from the substrate 202. The removal of the dielectric layer 302 and the electrode layer 304 of the dummy gate structure 602 results in an opening or trench 802 exposing the top portions of the fin elements 204a, 204b, 204c, 204d and top surfaces of the STI features 208 in the channel regions. A gate structure (e.g., including a high-K dielectric layer and metal gate electrode) may be subsequently formed in the trench or opening 802, as described below. The removal of the dummy gate structure 602 may be performed using a selective etching process, such as a selective wet etching, a selective dry etching, or a combination thereof.

Figure 8C:
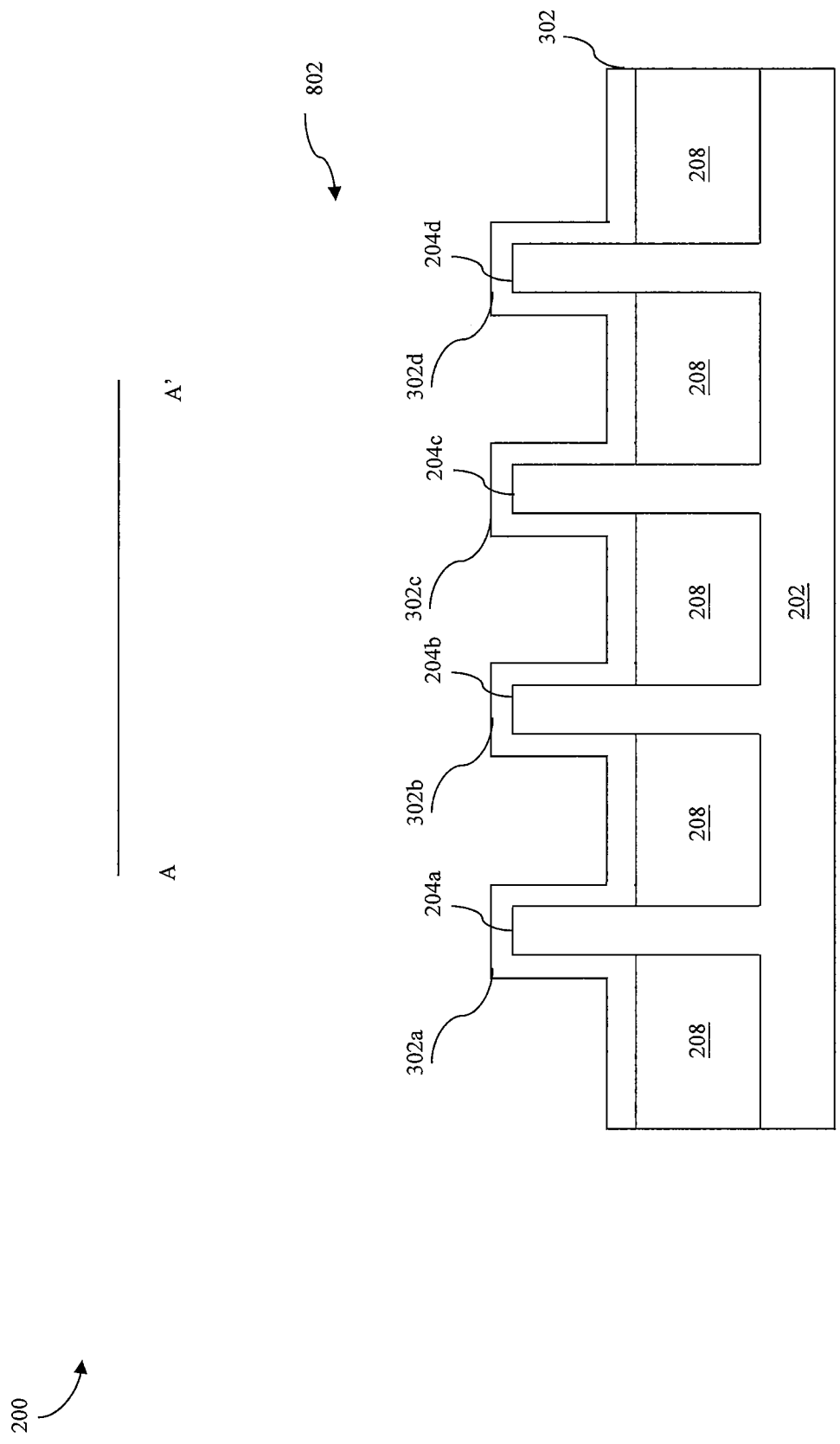
FIG. 8C is a cross-sectional view of a portion of a semiconductor device according to some embodiments.
Figure 8D:
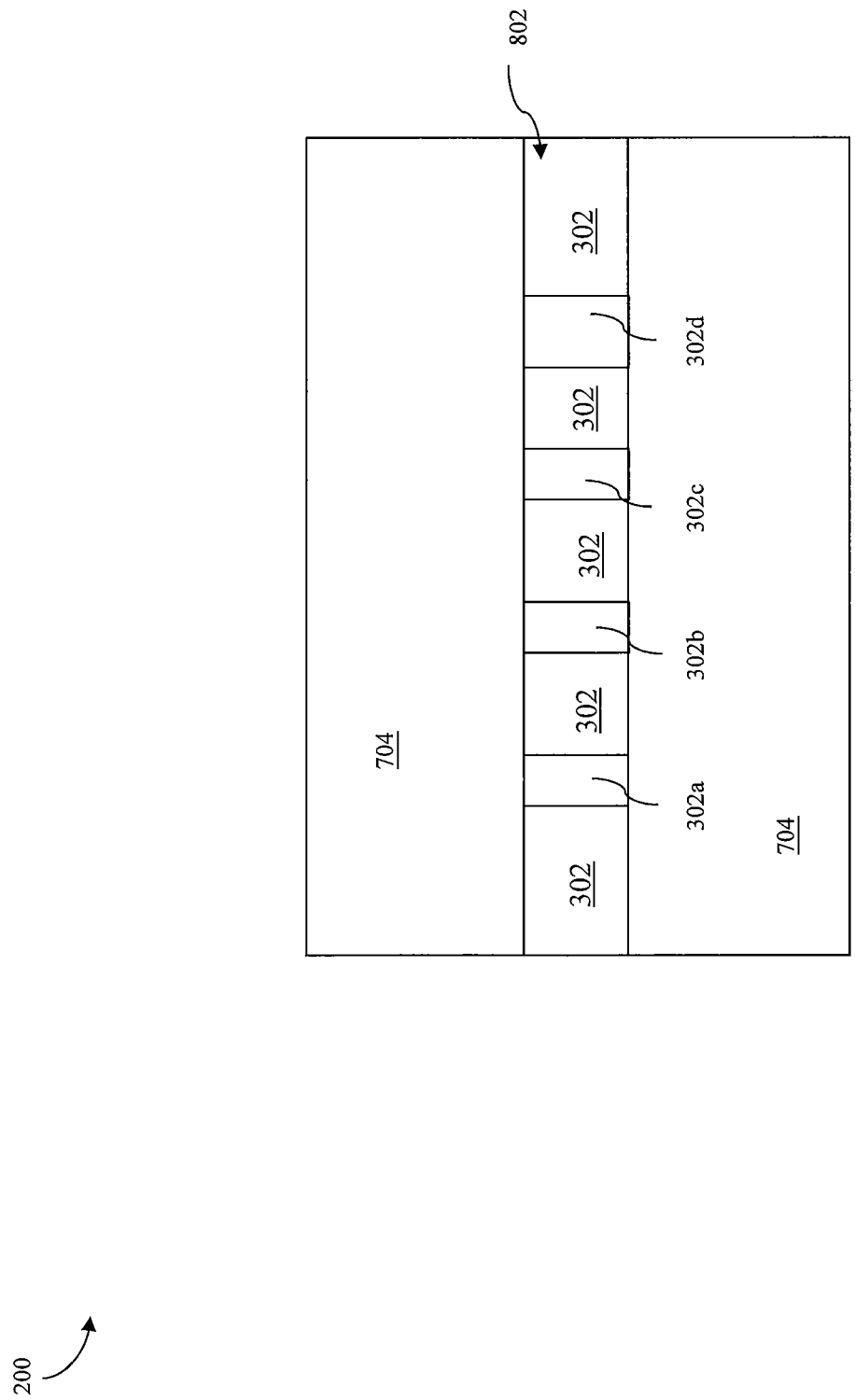
FIG. 8D is a top view of a portion of a semiconductor device of FIG. 8C according to some embodiments.

Referring to FIGS. 8C and 8D, illustrated therein are a cross-sectional view of the device 200 along the A-A' line of FIG. 6A and a top view of the device 200 of FIG. 8C respectively, where after removing the electrode layer 304 of the dummy gate structure 602, the dielectric layer 302 of the dummy gate structure 602 is not removed. The removal of the electrode layer 304 results in a trench 802, exposing the dielectric layer 302 of the dummy gate structure 602. The exposed dielectric layer 302 includes portions 302a, 302b, 302c and 302d wrapping the top portions of the fin elements 204a, 204b, 204c, and 204d, respectively. This dielectric layer 302 is used as a high-k dielectric layer of the gate structure in subsequent steps as described below.

In some embodiments, etching processes are performed to remove the electrode layer 304 and/or the dielectric layer 302 of the dummy gate structure 602. The etching processes may include dry etching (e.g., RIE etching), wet etching, and/or other etching methods. In some examples where the electrode layer 304 of the dummy gate structure 602 includes gaps that cause preferential etching, after the etching processes, there are residues of the electrode layer 304 and the dielectric layer 302 in the channel regions (e.g., on the top surfaces of the STI 208 and fin elements 204a, 204b, 204c, and 204d in the channel regions). In some examples, the residues may be formed during a spacer formation process. Such residues may cause defect in subsequently formed gate structure. Therefore, by removing gaps in the electrode layer 304 at block 104, residues (e.g., formed during a spacer formation process) in the source/drain regions after the etching processes are reduced or removed, which help reduce defects in subsequent formed source/drain features.

In some embodiments, at block 116, where the electrode layer 304 includes polysilicon (e.g., recrystallized polysilicon formed from amorphous silicon), there are residues after the wet etching process is performed. Such residues may be caused by different etching rates along different orientation in the polysilicon. In some embodiments where an electrode layer 304 including amorphous silicon is formed at block 104, the amorphous silicon remains amorphous (e.g., without crystallizing to form polysilicon) during the processes after block 104 (e.g., during blocks 106, 108, 110, 112, and 114) including the treatment processes 500 and 750 until the electrode layer 304 is removed at block 116 for better silicon line width roughness (LWR) and line edge roughness (LER) control. Thus, by keeping the amorphous structure of the amorphous silicon, residues after performing the wet etching process to remove the electrode layer 304 are eliminated and/or reduced.

Figure 9A:
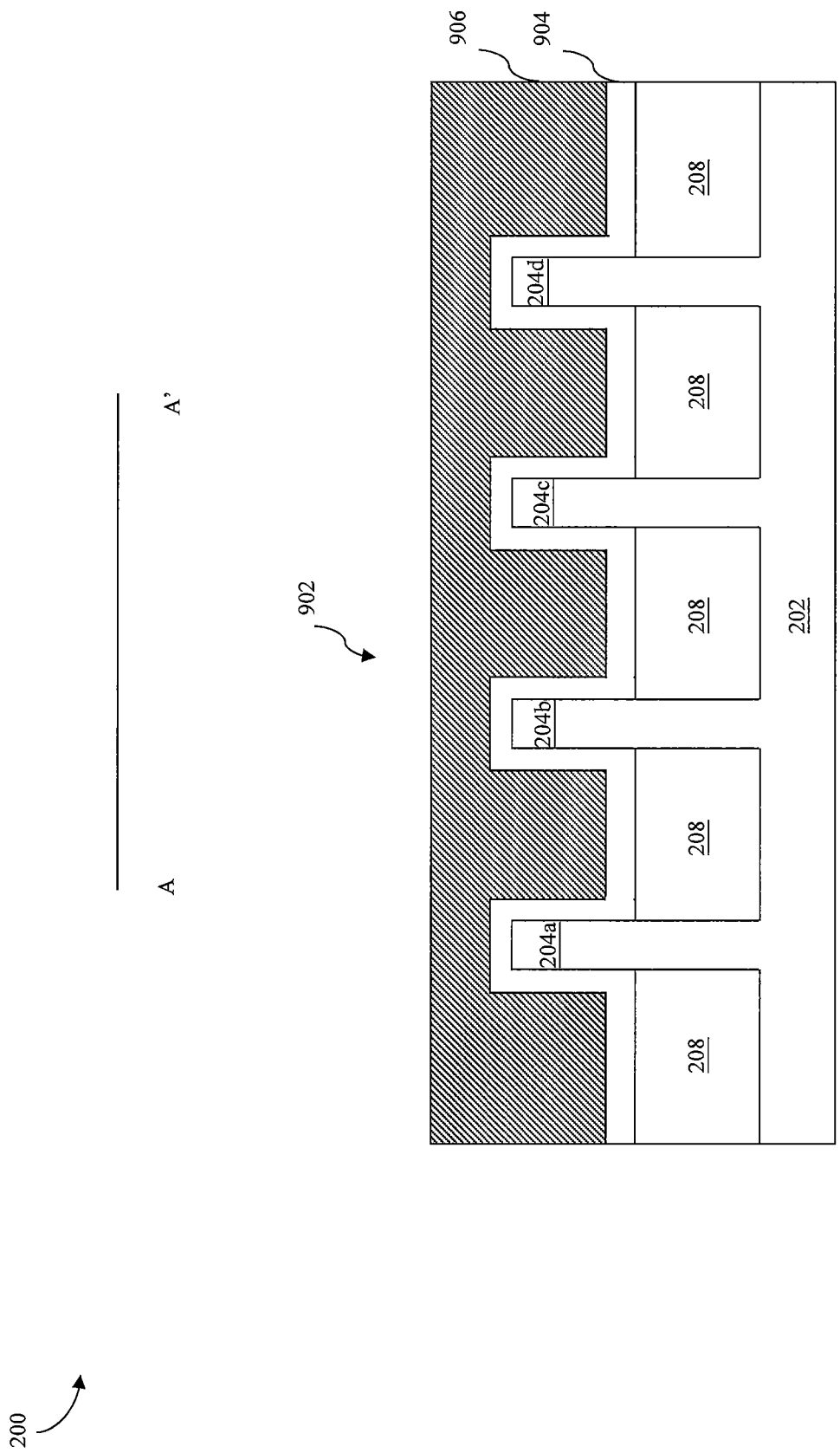
FIG. 9A is a cross-sectional view of a portion of a semiconductor device according to some embodiments.
Figure 9B:
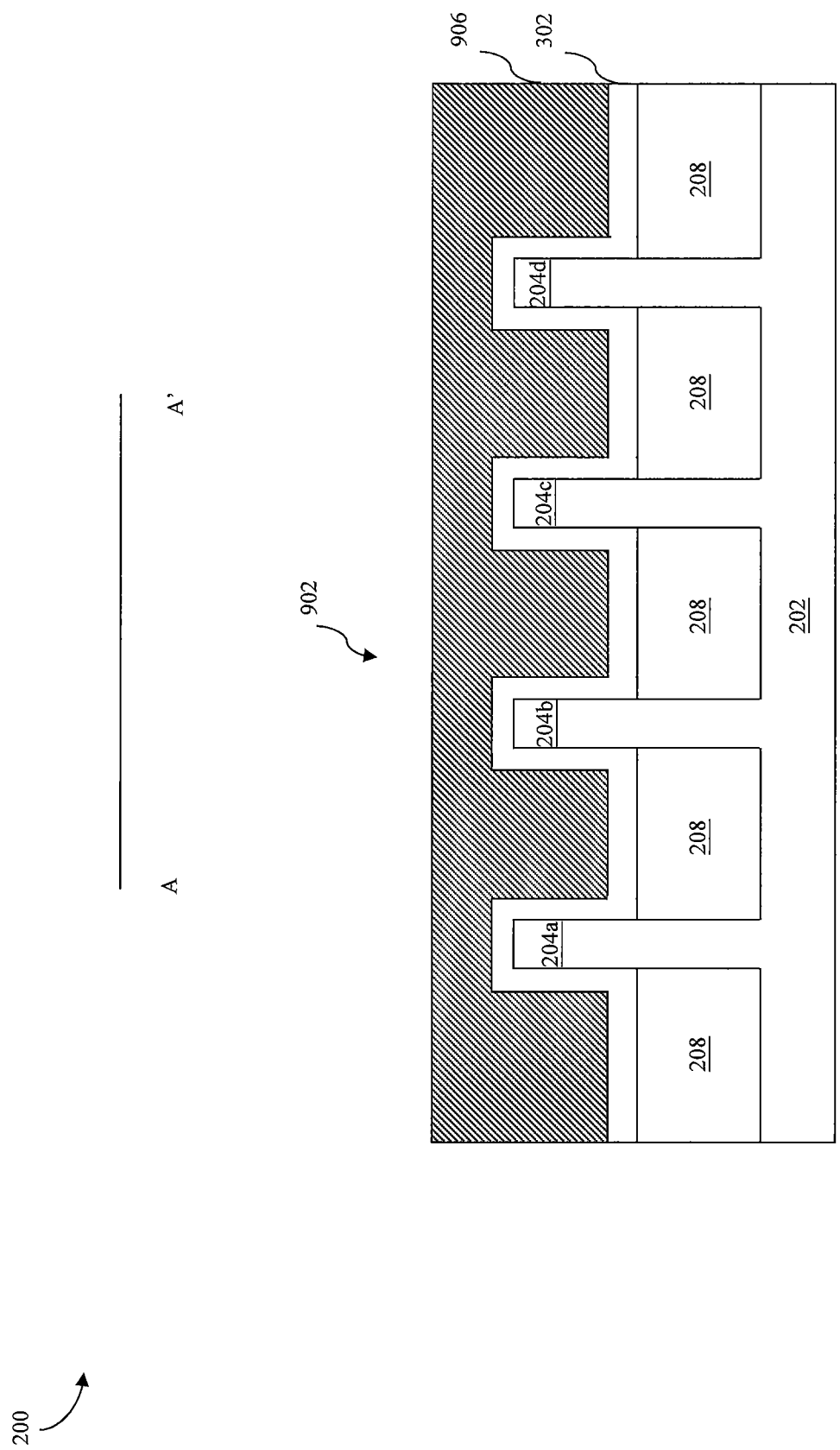
FIG. 9B is a cross-sectional view of a portion of a semiconductor device according to some embodiments.

Referring to FIGS. 1, 9A, and 9B, the method 100 then proceeds to block 118, where a replacement gate is formed.

Referring to the example of FIG. 9A, illustrated is a cross-sectional view along line A-A' of FIG. 6A, where a gate structure 902 is formed in the trench or opening over the fin elements 204a, 204b, 204c, and 204d in the channel region, so that the fin elements 204a, 204b, 204c, and 204d become the fins elements of a FinFET 200. In various embodiments, the gate structure 902 may include a high-K gate dielectric layer 904 formed over the channel region of the fin elements 204a, 204b, 204c, and 204d. High-K gate dielectrics, as used and described herein, include dielectric materials having a high dielectric constant, for example, greater than that of thermal silicon oxide (~3.9). The gate dielectric layer may be formed by ALD, physical vapor deposition (PVD), CVD, oxidation, and/or other suitable methods.

In some embodiments, the gate structure 902 includes a metal layer 906 formed over the high-k gate dielectric layer 904. The metal layer 906 used within high-K/metal gate stack may include a metal, metal alloy, or metal silicide. The metal layer 906 may include a single layer or alternatively a multi-layer structure, such as various combinations of a metal layer with a selected work function to enhance the device performance (work function metal layer), liner layer, wetting layer, adhesion layer, metal alloy or metal silicide. By way of example, the metal layer 906 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In addition, the metal layer 906 may provide an N-type or P-type work function, may serve as a transistor (e.g., FinFET) gate electrode, and in at least some embodiments, the metal layer 906 of the gate structure 902 includes a polysilicon layer. In various embodiments, the metal layer 906 of the gate structure 902 may be formed by ALD, PVD, CVD, e-beam evaporation, or other suitable process. Further, the metal layer 906 of the gate structure 902 may be formed separately for N-FET and P-FET transistors which may use different metal layers. In various embodiments, a CMP process may be performed to remove excessive metal from the metal layer 906 of the gate structure 902, and thereby provide a substantially planar top surface of the metal layer 906 of the gate structure 902.

Referring to FIG. 9B, illustrated is a cross-sectional view along line A-A' of FIG. 6A, where a gate structure 902 including the dielectric layer 302 and a metal layer 906 is formed. In the example of FIG. 9B, because the dielectric layer 302 remains in the channel region during block 116, no additional high-k dielectric layer between the fin elements and the metal layer 906 is formed in block 118.

The FinFET device 200 may undergo further processing to form various features and regions. For example, subsequent processing may form contact openings, contact metal, as well as various contacts, vias, wires, and multilayer interconnect features (e.g., metal layers and inter-level dielectrics) on the substrate 202, configured to connect the various features to form a functional circuit that may include one or more other devices. In furtherance of the example, a multilayer interconnection may include vertical interconnects, such as vias and contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or removed in accordance with various embodiments of the method 100.

It is noted that while FinFET devices are used as examples to describe the present disclosure, they are merely examples and are not intended to be limiting. One of skill in the art in possession of the present disclosure will recognize that a variety of devices, for example, various types of transistors and diodes, will benefit from the teachings herein and thus fall within the scope of the present disclosure.

The embodiments of the present disclosure offer advantages over existing art, though it is understood that other embodiments may offer different advantages, not all advantages are necessarily discussed herein, and that no particular advantage is required for all embodiments. One of the advantages in some embodiments is that by performing a treatment process including a laser anneal process and/or a thermal treatment process to a trench filling material layer, gaps (e.g., voids and/or seams) in the trench filling material are removed. As such, defects resulted from preferential etching of the trench filling material layer in subsequent processes are reduced and/or eliminated. Another advantage of some embodiments is that by using a pulsed laser having a short pulse duration (e.g., less than about 500 ns), a low thermal budget solution for removing the gaps is achieved. In an example, the trench filling material layer includes an amorphous material (e.g., amorphous silicon), which keeps its amorphous structure during the laser anneal process because of the low thermal budget of the laser anneal process. Yet another advantage of some embodiments is that the efficiency and accuracy of the laser anneal process is improved by adjusting the energy applied to different regions during the laser anneal process (e.g., based on locations of the fin elements).

Thus, in an embodiment provided is a method of semiconductor device fabrication includes providing a substrate including a first fin element and a second fin element extending from the substrate. A trench is disposed between top portions of the first fin element and the second fin elements extending above a top surface of the isolation feature. A first layer is deposited over the first and second fin elements to fill the trench. A gap is formed in the first layer. A laser anneal process is performed to the substrate to remove the gap. An energy applied to the substrate during the laser anneal process is adjusted based on a height of the first layer.

The present disclosure also provides an embodiment of a method includes providing a substrate including a plurality of fin elements extending from the substrate. A dummy gate structure is formed over the substrate by depositing a dummy gate electrode layer over the substrate. The dummy gate electrode layer includes a first set of gaps disposed between adjacent fin elements. A first pulsed laser anneal process is performed to the dummy gate electrode layer to remove the first set of gaps.

The present disclosure also provides an embodiment of a method of semiconductor device fabrication includes forming an isolation feature between a first fin and a second fin disposed over a substrate. A dummy gate electrode layer is formed over the first and second fins. The dummy gate electrode layer includes an amorphous material and an air pocket, and wherein the air pocket is disposed between the first and second fins. A thermal treatment process is performed to the dummy gate electrode layer to remove the air pocket. An inter-level dielectric (ILD) layer is formed over the substrate. The dummy gate electrode layer is removed to form a trench in the ILD layer. A gate structure is formed in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a substrate including a first fin element and a second fin element extending from the substrate;
forming a first layer including a first material over the first and second fin elements, wherein the first layer includes a gap disposed between the first and second fin elements, wherein the first material includes an amorphous material; and
performing an anneal process to remove the gap in the first layer, wherein performing the anneal process includes:
measuring reflectivity of the first layer to determine that the amorphous material remains amorphous; and
adjusting an energy applied to the first layer during the anneal process based on the measured reflectivity, wherein the gap is filled by a portion of the first material around the gap reaching a sub-melt temperature that is different from a melting point of the first material.

2. The method of claim 1, wherein the amorphous material remains amorphous during the anneal process.

3. The method of claim 2, wherein the amorphous material is amorphous silicon.

4. The method of claim 1, wherein the first layer includes a dummy gate electrode layer, further comprising:
forming an inter-level dielectric (ILD) layer over the dummy gate electrode layer;
performing an ILD treatment process to the ILD layer to remove gaps in the ILD layer, wherein the amorphous material of the dummy gate electrode layer remains amorphous during the ILD treatment process.

5. The method of claim 1, wherein the performing the anneal process includes:
adjusting energy applied to the first layer to keep a temperature of the first material lower than a crystallization temperature of the first material.

6. The method of claim 1, wherein the measuring reflectivity of the first layer to determine that the amorphous material remains amorphous includes:
determining that amorphous material remains amorphous based on a difference between a first reflectivity measurement before performing the anneal process and a second reflectivity measurement during performing the anneal process and a second.

7. The method of claim 1, wherein during the anneal process, a normalized reflectivity determined using the measured reflectivity remains less than a predetermined threshold.

8. A method comprising:
providing a substrate including a first fin element and a second fin element extending from the substrate;
forming a first layer including an amorphous material over the first and second fin elements, wherein the first layer includes a gap disposed between the first and second fin elements; and
performing an anneal process to remove the gap in the first layer,
wherein the anneal process includes measuring reflectivity of the first layer to determine that the amorphous material remains amorphous.

9. The method of claim 8, wherein the amorphous material is amorphous silicon.

10. The method of claim 8, wherein during the anneal process, a normalized reflectivity determined using the measured reflectivity remains less than a predetermined threshold.

11. The method of claim 8, wherein the first layer includes a dummy gate electrode layer, further comprising:
forming an inter-level dielectric (ILD) layer over the dummy gate electrode layer;
performing an ILD treatment process to the ILD layer to remove gaps in the ILD layer, wherein the amorphous material of the dummy gate electrode layer remains amorphous during the ILD treatment process.

12. The method of claim 8, wherein the performing the anneal process includes:
adjusting energy applied to the first layer to keep a temperature of the amorphous material lower than a crystallization temperature of the amorphous material.

13. The method of claim 8, further comprising:
performing an etching process to remove the first layer.

14. The method of claim 8, wherein a first gap of the first layer is removed by a reflowed first material around the first gap, and
wherein a second gap of the first layer is removed by thermal expansion and cooling shrinkage.

15. A method comprising:
providing a substrate including a first fin element and a second fin element extending from the substrate;
forming a first layer including an amorphous material over the first and second fin elements;
performing a first treatment process to remove gaps in the first layer;
forming a second layer over the first layer; and
performing a second treatment process to the second layer;
wherein the amorphous material of the first layer remains amorphous during the first and second treatment processes.

16. The method of claim 15, wherein the first layer includes a dummy gate electrode layer, and the second layer includes an inter-level dielectric (ILD) layer.

17. The method of claim 16, further comprising:
removing the dummy gate electrode layer thereby forming a trench in the ILD layer; and
forming a gate structure in the trench.

18. The method of claim 15, wherein the amorphous material is amorphous silicon.

19. The method of claim 15, wherein the first treatment process includes a laser anneal process.

20. The method of claim 15, wherein the second treatment process includes a thermal treatment process.

* * * * *